United States Patent
Lee et al.

(10) Patent No.: US 12,242,181 B2
(45) Date of Patent: Mar. 4, 2025

(54) PHOTOMASK ASSEMBLY AND METHOD OF FORMING THE SAME

(71) Applicant: Taiwan Semiconductor Manufacturing Company, Ltd., Hsinchu (TW)

(72) Inventors: Kuo-Hao Lee, Hsinchu (TW);
Hsi-Cheng Hsu, Taichung (TW);
Jui-Chun Weng, Taipei (TW);
Han-Zong Pan, Hsinchu (TW);
Hsin-Yu Chen, Hsinchu (TW);
You-Cheng Jhang, Changhua (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/362,046

(22) Filed: Jul. 31, 2023

(65) Prior Publication Data
US 2023/0384664 A1    Nov. 30, 2023

Related U.S. Application Data

(63) Continuation of application No. 17/813,165, filed on Jul. 18, 2022, now Pat. No. 11,789,360, which is a continuation of application No. 16/949,771, filed on Nov. 13, 2020, now Pat. No. 11,392,024.

(51) Int. Cl.
*G03F 1/64*     (2012.01)
*G03F 1/22*     (2012.01)
*G03F 1/62*     (2012.01)

(52) U.S. Cl.
CPC .................. *G03F 1/64* (2013.01); *G03F 1/22* (2013.01); *G03F 1/62* (2013.01)

(58) Field of Classification Search
CPC .................. G03F 1/22; G03F 1/62; G03F 1/64
USPC ............................................................. 430/5
See application file for complete search history.

(56) References Cited

U.S. PATENT DOCUMENTS

| | | | |
|---|---|---|---|
| 4,131,363 A | 12/1978 | Shea et al. | |
| 9,454,074 B2 | 9/2016 | Seo et al. | |
| 9,864,270 B2 | 1/2018 | Ma et al. | |
| 10,162,258 B2 | 12/2018 | Lin et al. | |
| 10,859,901 B2 | 12/2020 | Nam et al. | |
| 11,392,024 B2 | 7/2022 | Lee et al. | |
| 11,789,360 B2 * | 10/2023 | Lee .......................... | G03F 1/22 430/5 |
| 2010/0271612 A1 | 10/2010 | Lin et al. | |
| 2016/0172207 A1 | 6/2016 | Kwon et al. | |
| 2017/0090278 A1 | 3/2017 | Chiu et al. | |
| 2019/0094683 A1 | 3/2019 | Yoo et al. | |
| 2022/0365423 A1 | 11/2022 | Lee et al. | |

FOREIGN PATENT DOCUMENTS

| | | |
|---|---|---|
| CN | 106997847 A | 8/2017 |
| KR | 20150004168 A | 1/2015 |
| TW | 201721282 A | 6/2017 |
| TW | 201918372 A | 5/2019 |

* cited by examiner

*Primary Examiner* — Christopher G Young
(74) *Attorney, Agent, or Firm* — Harrity & Harrity, LLP

(57) ABSTRACT

A portion of a buffer layer on a backside of a substrate of a photomask assembly may be removed prior to formation of one or more capping layers on the backside of the substrate. The one or more capping layers may be formed directly on the backside of the substrate where the buffer layer is removed from the substrate, and a hard mask layer may be formed directly on the one or more capping layers. The one or more capping layers may include a low-stress material to promote adhesion between the one or more capping layers and the substrate, and to reduce and/or minimize peeling and delamination of the capping layer(s) from the substrate. This may reduce the likelihood of damage to the pellicle layer and/or other components of the photomask assembly and/or may increase the yield of an exposure process in which the photomask assembly is used.

20 Claims, 19 Drawing Sheets

PHOTOMASK ASSEMBLY AND METHOD OF FORMING THE SAME

RELATED APPLICATIONS

This application is a continuation of U.S. patent application Ser. No. 17/813,165, filed Jul. 18, 2022, which is a continuation of U.S. patent application Ser. No. 16/949,771, filed Nov. 13, 2020 (now U.S. Pat. No. 11,392,024), the contents of which are incorporated herein by reference in their entireties.

BACKGROUND

A photomask assembly is an apparatus that is used to transfer a pattern (e.g., a die layer pattern, an integrated circuit pattern, and/or the like) to a wafer. A photomask assembly may include a photomask on which a pattern is formed, a frame to which the photomask is attached and a pellicle layer to protect the pattern from damage and dust that could otherwise cause defects in the transfer of the pattern to a substrate. A pellicle may be mounted on a pellicle frame, which separates the pellicle from the photomask.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
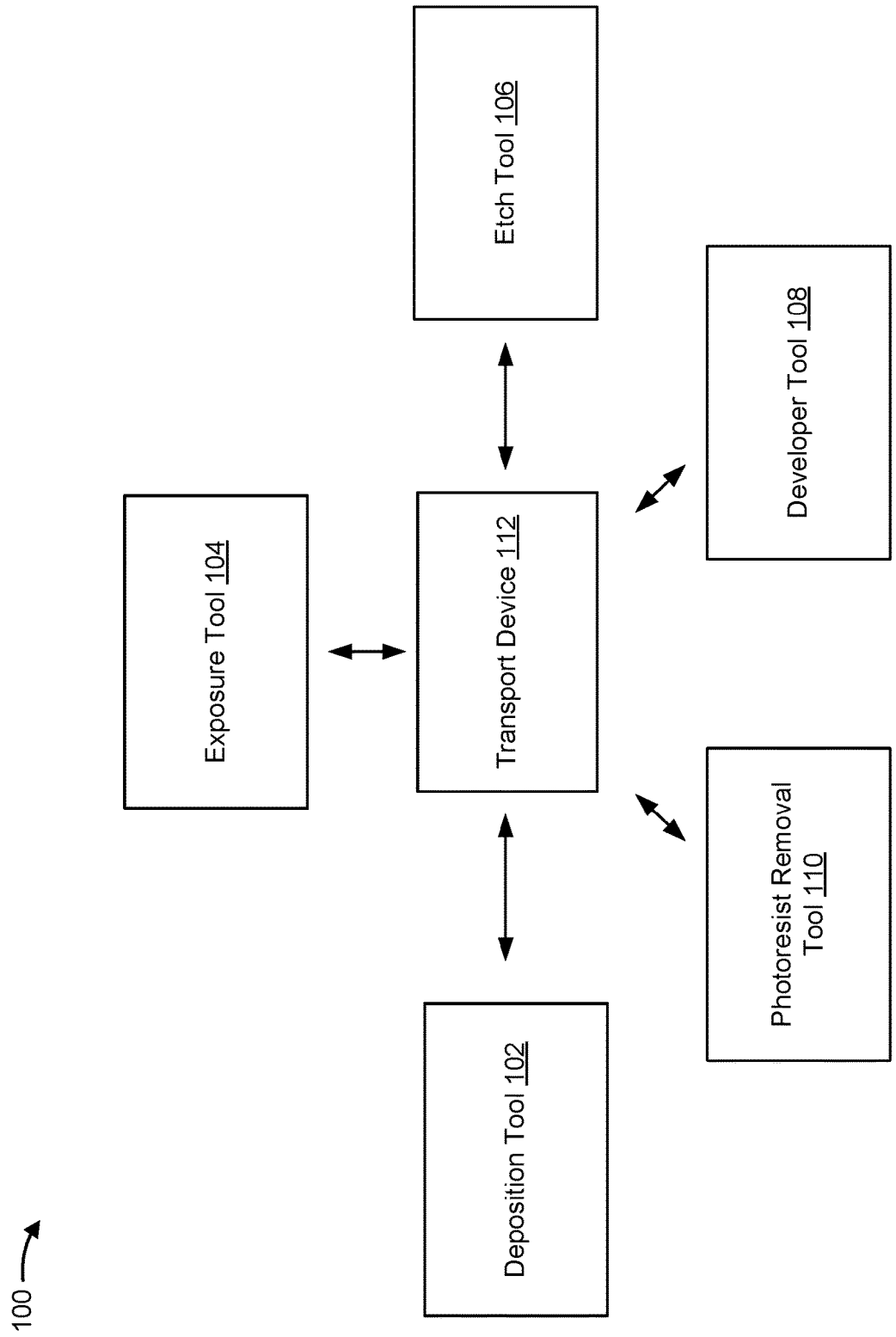
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A hard mask layer may be used as a pattern by which a pellicle frame of a photomask assembly is etched. A hard mask layer may be deposited onto a capping layer of the photomask assembly during manufacturing of the photomask assembly. A buffer layer may be formed between material of the pellicle frame and material of the capping layer to promote adhesion between the pellicle frame material and the capping layer material.

Due to the high extreme ultraviolet (EUV) light absorption of the buffer layer, a first portion of the buffer layer may be removed after the pellicle frame is etched based on the pattern of the hard mask layer. However, a second portion of the buffer layer remains between the pellicle frame of the photomask and the capping layer on which the hard mask layer was formed. A wet etch may be performed to remove the first portion of the buffer layer, which can cause the second portion of the buffer layer to be undercut. This undercutting of the second portion of the buffer layer between the pellicle frame of the photomask and the capping layer on which the hard mask layer was formed may cause the hard mask layer to become unstable and delaminate or peel away from the pellicle frame, resulting in damage to the pellicle layer and/or other components of the photomask assembly.

Some implementations described herein provide a photomask assembly, techniques and apparatuses for forming the photomask assembly, and a system in which the photomask assembly may be used. During manufacturing of the photomask assembly, a buffer layer may be deposited onto a substrate. A portion of the buffer layer on a backside of the substrate may be removed prior to formation of one or more capping layers on the backside of the substrate. The one or more capping layers may be formed directly on the backside of the substrate where the buffer layer is removed from the substrate. The one or more capping layers may include a low-stress material to promote adhesion between the one or more capping layers and the substrate, and to reduce and/or minimize peeling and delamination of the capping layer(s) from the substrate. A hard mask layer may be formed on the capping layer(s) on the backside of the substrate. The hard mask layer may be patterned, and the pattern may be used to etch the capping layer(s), the substrate, and one or more other layers to define the pellicle frame of the photomask assembly.

In this way, the capping layer(s) and the hard mask of a photomask assembly may be formed on the substrate without an intervening buffer layer. This may reduce the likelihood that the hard mask becomes unstable and delaminate or peel away from the frame of the photomask assembly. This may reduce the likelihood of damage to the pellicle layer and/or other components of the photomask assembly and/or may increase the yield of an exposure process in which the photomask assembly is used.

FIG. 1 is a diagram of an example environment 100 in which systems and/or methods described herein may be implemented. As shown in FIG. 1, environment 100 may include a plurality of semiconductor processing tools 102-110 and a transport device 112. The plurality of semiconductor processing tools 102-110 may include a deposition tool 102, an exposure tool 104, an etch tool 106, a developer tool 108, a photoresist removal tool 110, and/or other the like. The tools included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a chemical vapor deposition (CVD) tool, such as an atomic layer deposition (ALD) tool, an epitaxy tool, a metal organic CVD (MOCVD) tool, a plasma-enhanced CVD (PECVD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light source, and/or the like), an x-ray source, an electron beam (e-beam) source, and/or the like. The exposure tool 104 may expose the photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The etch tool 106 is a semiconductor processing tool that is capable of etching various types of materials of a substrate, wafer, or semiconductor device. For example, the etch tool 106 may include a wet etch tool, a dry etch tool, and/or the like. In some implementations, the etch tool 106 includes a chamber that is filled with an etchant, and the substrate is placed in the chamber for a particular time period to remove particular amounts of one or more portions of the substrate. In some implementations, the etch tool 106 may etch one or more portions of a the substrate using a plasma etch or a plasma-assisted etch, which may involve using an ionized gas to isotopically or directionally etch the one or more portions.

The developer tool 108 is a semiconductor processing tool that is capable of developing a photoresist layer that has been exposed to a radiation source to develop a pattern transferred to the photoresist layer from the exposure tool 104. In some implementations, the developer tool 108 develops a pattern by removing unexposed portions of a photoresist layer. In some implementations, the developer tool 108 develops a pattern by removing exposed portions of a photoresist layer. In some implementations, the developer tool 108 develops a pattern by dissolving exposed or unexposed portions of a photoresist layer through the use of a chemical developer.

The photoresist removal tool 110 is a semiconductor processing tool that is capable of removing remaining portions of a photoresist layer from a substrate after the etch tool 106 removes portions of the substrate. For example, the photoresist removal tool 110 may use a chemical stripper and/or another technique to remove a photoresist layer from a substrate.

Transport device 112 includes a mobile robot, a robot arm, a tram or rail car, an overhead hoist transfer (OHT) vehicle, and/or another type of device that are used to transport photomask assemblies (or components thereof), wafers, and/or dies between semiconductor processing tools 102-110 and/or to and from other locations such as a wafer rack, a storage room, and/or the like. In some implementations, transport device 112 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
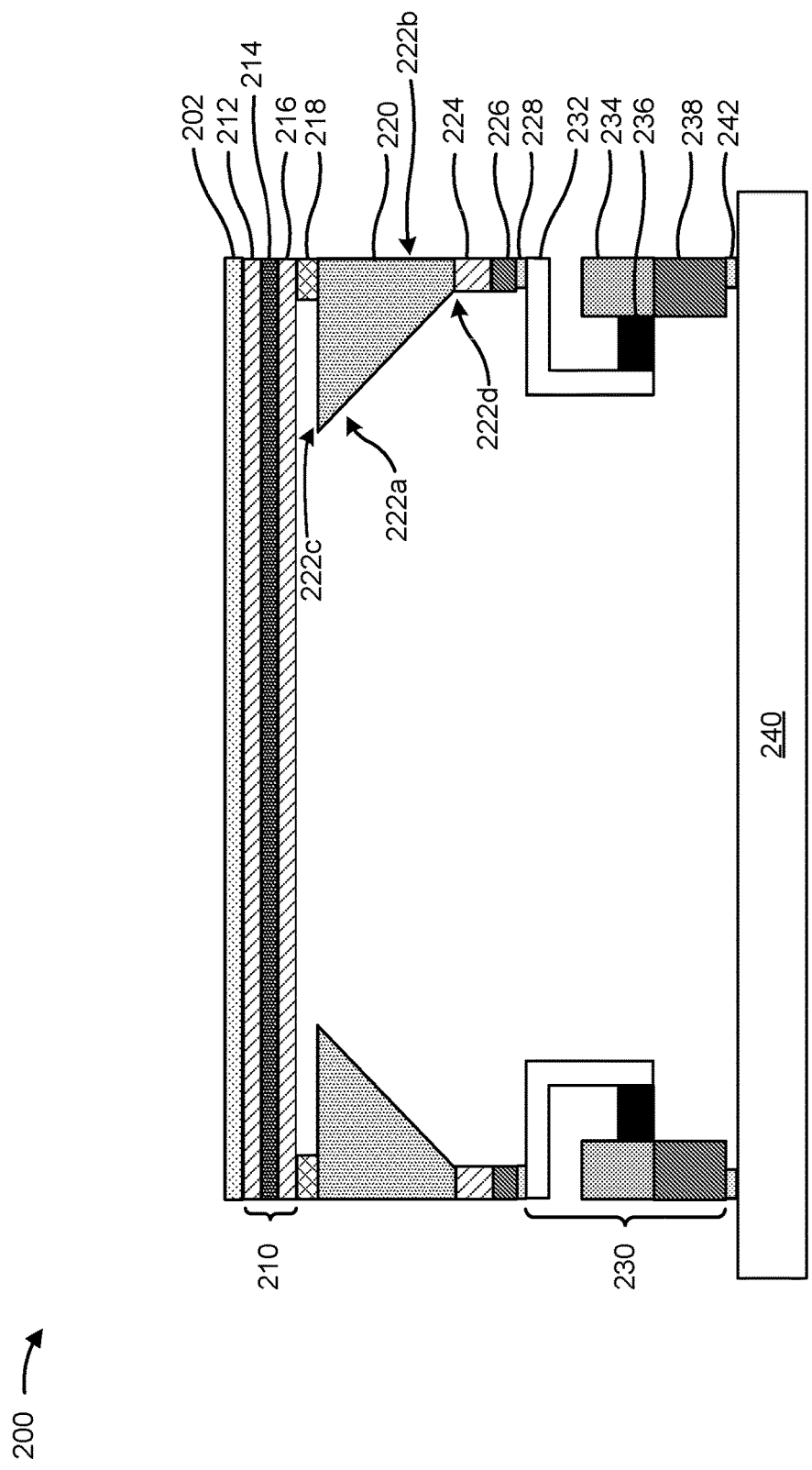
FIG. 2 is a diagram of an example photomask assembly described herein.

FIG. 2 is a diagram of a cross-sectional view of an example photomask assembly 200 described herein. The photomask assembly 200 may be an apparatus that is used to transfer a pattern (e.g., a die layer pattern, an integrated circuit pattern, and/or the like) to a wafer or a substrate. In some implementations, the photomask assembly 200 may be used in an exposure tool (e.g., the exposure tool 104, exposure tool 500 of FIG. 5, and/or another exposure tool). As shown in FIG. 2, the photomask assembly 200 may include various components and/or subsystems, such as a cooling layer 202, a pellicle 210, a pellicle frame 220, a photomask frame 230, and a photomask 240, among other examples.

The cooling layer 202 includes a layer of material that dissipates heat generated during a lithography patterning process. The heat dissipation properties of the cooling layer 202 may reduce warpage, deformation, and/or other heat-related degradations. In some implementations, the cooling layer 202 includes ruthenium (Ru), a carbon-based material (e.g., graphite, grapheme, diamond, carbon nanotube, and/or the like), or another thermally conductive material. The cooling layer 202 may have a thickness ranging from approximately 3 nanometers (nm) to approximately 10 nm.

The pellicle 210 may include a plurality of layers that perform different functions, such as a capping layer 212 on a function layer 214, and another capping layer 216 on which the function layer 214 is formed. The pellicle 210 protects the photomask 240 from particles and other debris, and keeps the particles and other debris out of focus in the exposure tool so that the particles and other debris do not produce a patterned image, which may cause defects to be transferred to the wafer.

The capping layers 212 and 216 may protect the function layer 214 from chemicals and/or particles. For example, the function layer 214 may be formed of silicon, which may be susceptible to environmental chemicals and/or particles. The capping layers 212 and 216 may be thin without degrading the transparency of the pellicle 210. In some examples, the thickness of the capping layers 212 and 216 range from approximately 3 nm to approximately 10 nm. In some examples, the thickness of each of the capping layers 212 and 216 is approximately 5 nm with a variation of approximately 10% or less.

The function layer 214 may include one or more materials including silicon, such as polycrystalline silicon (poly-Si), amorphous silicon (a-Si), doped silicon (such as phosphorous doped silicon (SiP)), or a silicon-based compound. Alternatively, the function layer 214 includes a polymer, grapheme, or other suitable material. The function layer 214 may be formed to a thickness such that the function layer 214 has sufficient mechanical strength while not degrading the transparency of the function layer 214. In some examples, the function layer 214 may have a thickness ranging from approximately 30 nm to approximately 50 nm.

The pellicle 210 may be attached, bonded, glued, or otherwise secured to the pellicle frame 220 by a buffer layer 218. The buffer layer 218 may be formed of an adhesive material such as a thermal plastic elastomer or other macromolecular adhesive material cured by heat or drying. In some implementations, the buffer layer 218 includes Styrene Ethylene/Butylene Styrene rubber (SEBS), Thermoplastic Polyester Elastomer (TPE), polyether urethane (TPU), Thermoplastic Olefinic elastomer (TPO), Thermoplastic Vulcanisate (TPV), or another adhesive material. The buffer layer 218 may also function as an etch-stop layer during manufacturing of the photomask assembly 200 due to the etching selectivity of the buffer layer 218 relative to the material of the pellicle frame 220.

The pellicle frame 220 may be a mounting structure on which the pellicle 210 is mounted via the buffer layer 218. The pellicle frame 220 may be formed of silicon, a silicon oxide ($SiO_x$), or another material having sufficient rigidity to support the pellicle 210 (e.g., during lithography patterning process). As shown in FIG. 2, the pellicle frame 220 may have a plurality of sides 222, such as an inner side 222a (e.g., which may be angled, straight, curved, or formed of a different geometry), an outer side 222b, a top side 222c facing the pellicle 210, and a bottom side 222d facing the photomask frame 230 and the photomask 240. The pellicle 210 may be bonded to the top side 222c of the pellicle frame 220. In particular, the capping layer 216 of the pellicle 210 may be bonded to an outer portion of the top side 222c (e.g., a portion of the top side 222c toward or located near the outer side 222b) via the buffer layer 218.

A lower capping layer 224 may be located on the bottom side 222d of the pellicle frame 220. The lower capping layer 224 may be formed during formation of the capping layers 212 and 216, and may be formed from a combination of the capping layers 212 and 216. Unlike the capping layers 212 and 216, the lower capping layer 224 may be formed directly on the pellicle frame 220 (e.g., without an intervening buffer layer between the bottom side 222d of the pellicle frame 220 and the lower capping layer 224).

The lower capping layer 224 may be formed during formation of the capping layer 212 and the capping layer 216. In some implementations, the lower capping layer 224 is a single continuous capping layer directly on the bottom side 222d of the pellicle frame 220. In some implementations, the lower capping layer 224 includes two or more layers formed as a part of two or more deposition procedures. For example, a first layer of the lower capping layer 224 may be formed directly on the pellicle frame 220 during deposition of the capping layer 216 and a second layer of the lower capping layer 224 may be formed directly on the first layer during deposition of the capping layer 212. In these examples, a thin layer of native oxide material may be present between the two or more capping layers of the lower capping layer 224.

In some implementations, the capping layer 212, the capping layer 216, and the lower capping layer 224 are formed of a low-stress material (e.g., a low tensile strength material) to promote adhesion between the pellicle frame 220 and the capping layer 212, the capping layer 216, and the lower capping layer 224. As indicated above, the lower capping layer 224 is formed directly on the pellicle frame, which may result in a lattice mismatch between the material of the lower capping layer and a material of the pellicle frame. The lattice mismatch may cause warping, peeling, and/or delamination of the lower capping layer 224 if the lower capping layer 224 is formed of a material that is too stiff (e.g., a high tensile strength material). Accordingly, the capping layer 212, the capping layer 216, and the lower capping layer 224 may be formed of the low-stress material to reduce warping of the pellicle frame 220, to reduce peeling and/or delamination of the lower capping layer 224 that might otherwise occur due to the lattice mismatch.

The low-stress material may be a material having a tensile strength that is lower than the material of the pellicle frame 220. In some implementations, the low-stress material is a material having a tensile strength of less than approximately 600 megapascals. Examples of low-stress materials that may be used to form the capping layer 212, the capping layer 216, and the lower capping layer 224 include (but are not limited to) a silicon oxide ($SiO_x$), a silicon nitride ($Si_xN_y$), or a boron nitride (BN).

A hard mask layer 226 may be located on the lower capping layer 224 over the bottom side 222d of the pellicle frame 220. The hard mask layer 226 may be used during etching of the pellicle frame 220. In particular, a pattern may be formed in the hard mask layer 226, and the pellicle frame 220 may be etched based on the pattern in the hard mask layer 226. The hard mask layer 226 may be formed of a material having an etch selectivity that permits the pellicle frame 220 to be etched based without (or with minimal) etching of the hard mask layer 226. In some implementations, the material of the hard mask layer 226 includes ruthenium (Ru), ruthenium silicon (RuSi), a combination thereof, or another hard mask material.

The pellicle frame 220 may be attached, bonded, glued, or otherwise secured to the photomask frame 230. In particular, the pellicle frame 220 may attach to the photomask frame 230 at the hard mask layer 226. In some implementations, the photomask frame 230 may attach to the hard mask layer 226 via a buffer layer 228. The buffer layer 228 may be formed of an adhesive material such as a thermal plastic elastomer or other macromolecular adhesive material cured by heat or drying. In some implementations, the buffer layer 228 includes SEBS, TPE, TPU, TPO, TPV, or another adhesive material.

The photomask frame 230 may hold and/or support the pellicle frame 220 and the pellicle 210. The photomask frame 230 may be used to mount the pellicle frame 220 and the pellicle 210 to the photomask 240. The height of the pellicle frame 220 and the photomask frame 230 may be configured such that particles and/or other debris that lands on the surface of the pellicle 210 are out of focus during a lithography exposure process and are not transferred to the wafer.

The photomask frame 230 may include one or more components to reduce the transfer of force between the pellicle frame 220 and the photomask 240, to allow for ventilation of an internal cavity of the photomask assembly 200 between the pellicle 210 and the photomask 240, and/or the like. For example, the photomask frame 230 may include a bracket 232 that is mounted to a sidewall 234. A filter 236 may be placed between the bracket 232 and the sidewall 234 to allow for ventilation and pressure balance in the internal cavity during pressurization of the exposure tool. Moreover, the photomask frame 230 may include a gasket 238 to provide structural isolation between the photomask frame 230 and the photomask 240. The gasket 238 may reduce or prevent vibration and/or other mechanical stresses from being transferred from the photomask frame 230 to the photomask 240.

The photomask frame 230 may be attached, bonded, glued, or otherwise secured to the photomask 240 via a buffer layer 242. The buffer layer 242 may be formed of an adhesive material such as a thermal plastic elastomer or other macromolecular adhesive material cured by heat or drying. In some implementations, the buffer layer 242 includes SEBS, TPE, TPU, TPO, TPV, or another adhesive material.

The photomask 240 may include a pattern that is to be transferred to a resist layer on the wafer during a lithography patterning process. The photomask 240 may be formed by one or more photomask fabrication processes, such as a mask blank fabrication process, a mask patterning process, and/or the like. During a mask blank fabrication process, a mask blank is formed by depositing suitable layers (e.g., a plurality of reflective layers, a plurality of refractive layers, and/or the like) on a suitable substrate. In some implementations, the surface roughness of the mask blank is less than approximately 50 nm.

A capping layer (e.g., ruthenium) may be formed over the multilayer coated substrate followed by deposition of an absorber layer. The mask blank may then be patterned (e.g., the absorber layer is patterned) to form a desired pattern on the photomask 240. In some implementations, an anti-reflective coating (ARC) layer may be deposited over the absorber layer prior to patterning the mask blank. The patterned photomask 240 may then be used to transfer circuit and/or device patterns onto the wafer.

In some implementations, the photomask 240 may be fabricated to include different structure types such as, for example, a binary intensity mask (BIM) or a phase-shifting mask (PSM). An example BIM includes opaque absorbing regions and reflective regions, where the BIM includes a pattern (e.g., an integrated circuit pattern) to be transferred to the wafer. The opaque absorbing regions include an absorber that is configured to absorb incident light (e.g., incident EUV light). In the reflective regions, the absorber may be removed (e.g., during the mask patterning process described above) and the incident light is reflected by the multilayer. Additionally, in some implementations, the photomask 240 may be a PSM which utilizes interference produced by phase differences of light reflected therefrom. Examples of PSMs include an alternating PSM (AltPSM), an attenuated PSM (AttPSM), or a chromeless PSM (cPSM), among other examples. An AltPSM may include phase shifters (of opposing phases) disposed on either side of each patterned mask feature. In some examples, an AttPSM may include an absorber layer having a transmittance greater than zero (e.g., approximately a 6% intensity transmittance). In some cases, a cPSM may be described as a 100% transmission AltPSM, for example, because the cPSM does not include phase shifter material or chrome on the mask. In some implementations, the patterned layer of a PSM is a reflective layer with a material stack similar to that of a multi-layer structure.

In some implementations, the photomask assembly 200 includes other components, different components, and/or differently arranged components depending on the type of exposure tool in which the photomask assembly 200 is to be used. For example, if the photomask assembly 200 is to be used in a refractive-based exposure tool (e.g., a tool in which radiation energy is to travel through the photomask assembly 200), the photomask assembly 200 may include a transparent substrate and an absorption layer that is patterned to have one or more openings through which the radiation energy may travel without being absorbed by the absorption layer. As another example, if the photomask assembly 200 is to be used in a reflective-based exposure tool (e.g., an exposure tool in which radiation energy is to be reflected off of the photomask assembly 200), the photomask assembly 200 may include a substrate coated with a plurality of films to provide a reflective mechanism. In these cases, the photomask assembly 200 may include a plurality of alternating layers of silicon and molybdenum deposited on a substrate to act as a Bragg reflector that maximizes the reflection of the radiation energy.

The number and arrangement of components, structures, and/or layers shown in FIG. 2 are provided as one or more examples. In practice, there may be additional components, structures, and/or layers; fewer components, structures, and/or layers; different components, structures, and/or layers; and/or differently arranged components, structures, and/or layers than those shown in FIG. 2.

FIGS. 3A-3M are diagrams illustrating one or more example implementations 300 described herein. In some implementations, example implementation(s) 300 may be example implementation(s) of forming a photomask assembly, such as the photomask assembly 200 of FIG. 2 and/or other photomask assemblies having stress relief trenches formed therein.

Figure 3A:
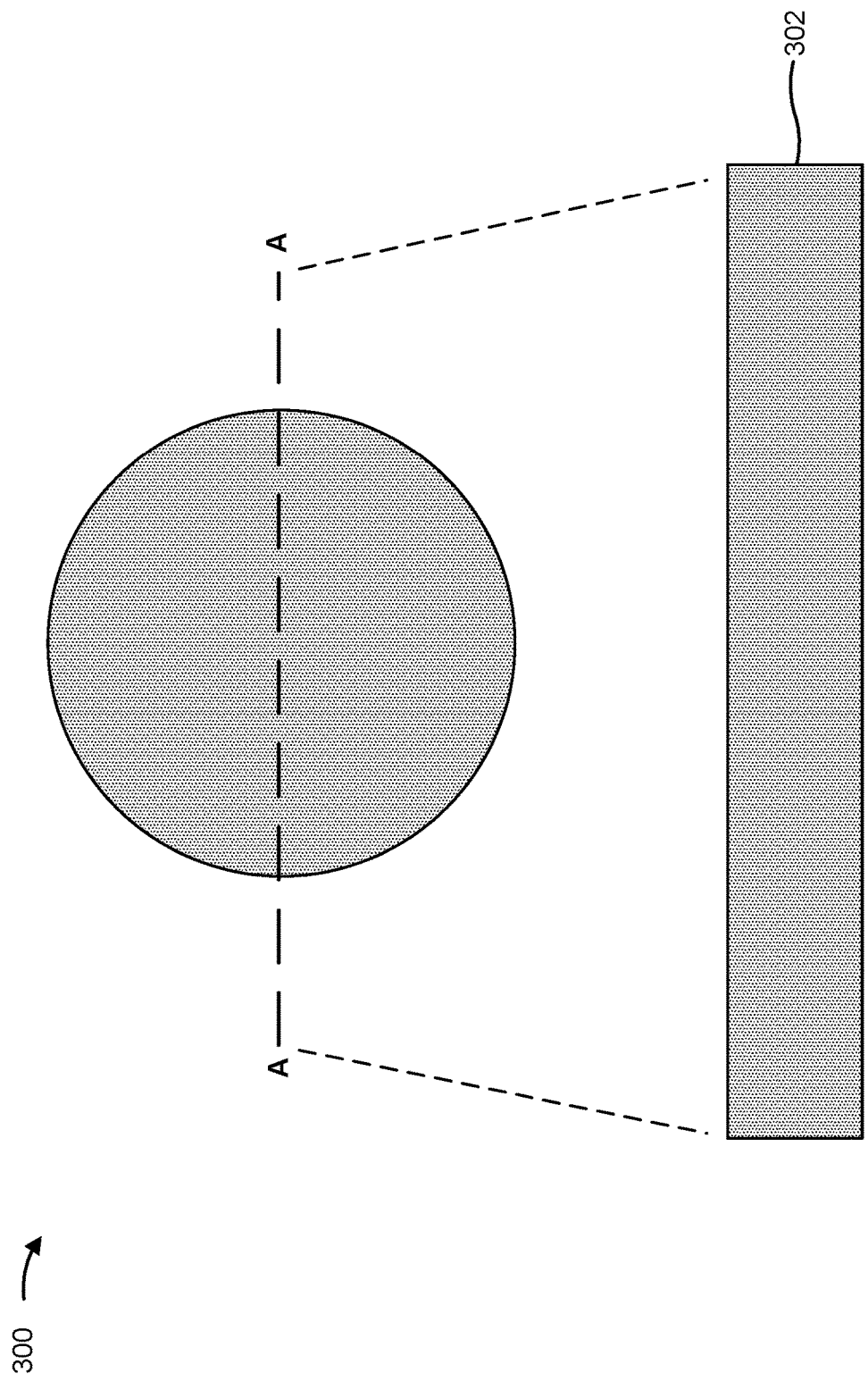
FIGS. 3A-3M are diagrams of one or more example implementations described herein.

FIG. 3A illustrates a top-down view and a cross-sectional view along line AA of a substrate 302. The substrate 302 may include a wafer (e.g., a 200 mm wafer, a 300 mm wafer, and/or the like) formed of silicon, crystal silicon, polycrystalline silicon, amorphous silicon, or another material.

Figure 3B:
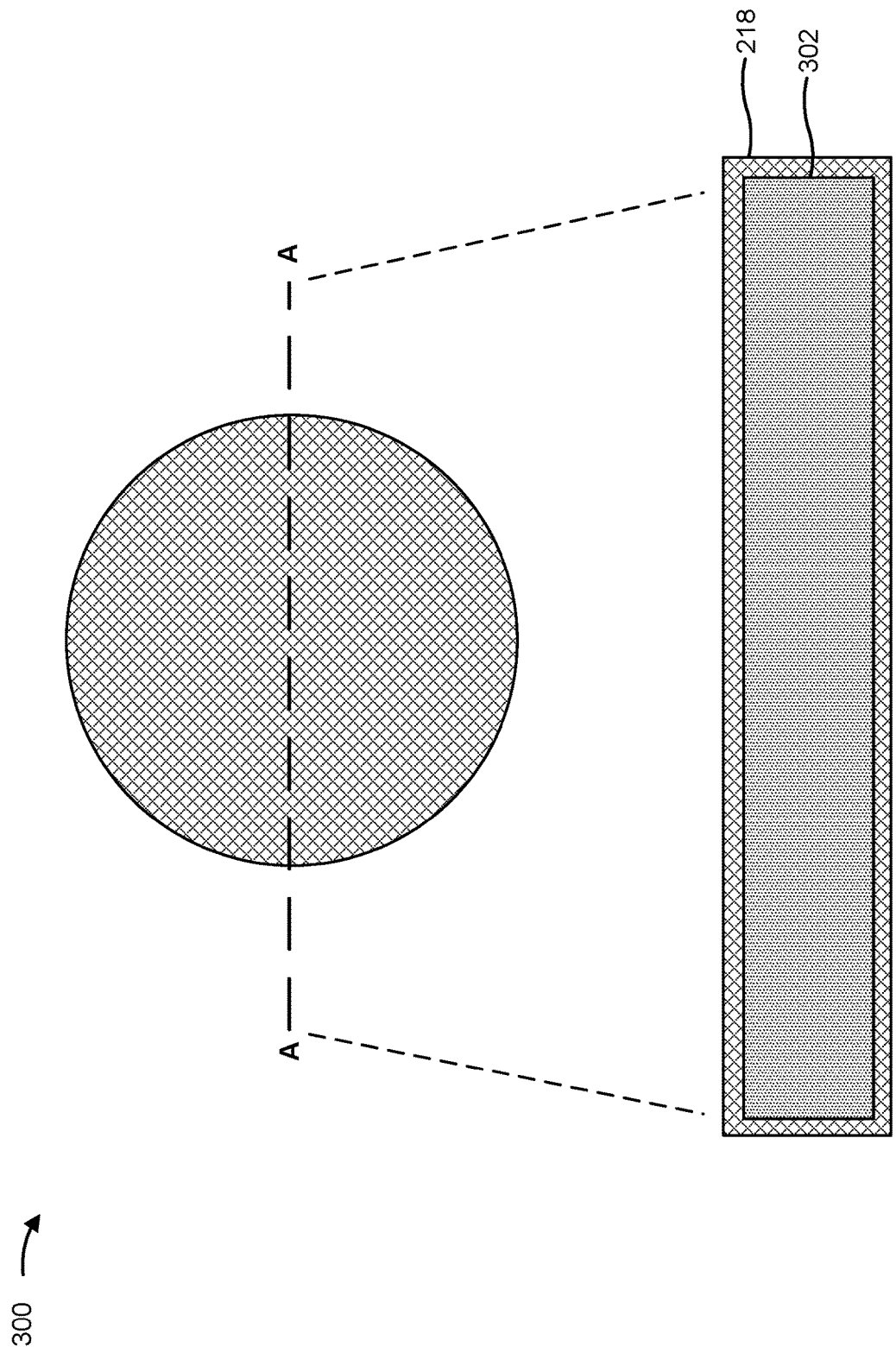

FIG. 3B illustrates another top-down view and another cross-sectional view along the line AA of the substrate 302. As shown in FIG. 3B, one or more semiconductor processing tools may form a buffer layer 218. For example, the deposition tool 102 may form the buffer layer 218 by a deposition process, such as a spin-coating process, a PVD process, a CVD process, an ALD process, or another type of deposition process. In some implementations, the deposition tool 102 forms the buffer layer 218 on a top side of the substrate 302. In some implementations, the deposition tool 102 forms the buffer layer 218 around the substrate 302 such that the buffer layer 218 is formed on the top side, on a bottom side (or back side), on a left side, and on a right side of the substrate 302.

Figure 3C:
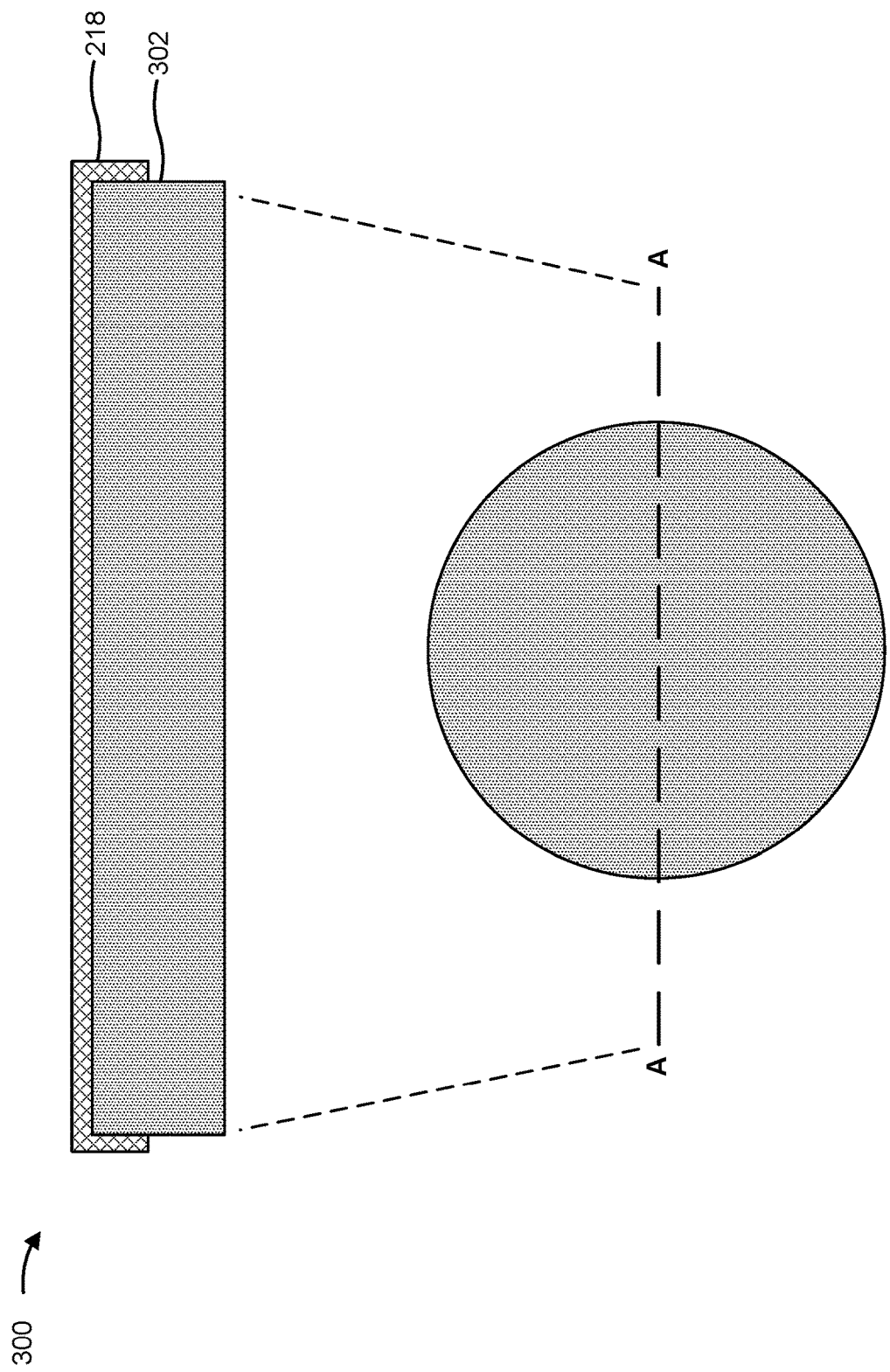

FIG. 3C illustrates a bottom-up view and another cross-sectional view along line AA of the substrate 302. As shown in FIG. 3C, one or more semiconductor processing tools may remove a portion of the buffer layer 218 from the substrate 302. In particular, one or more semiconductor processing tools may remove a portion of the buffer layer 218 from the bottom side (or the back side) of the substrate 302. In some implementations, the one or more semiconductor processing tools may remove a portion of the buffer layer 218 from the left side and/or from the right side of the substrate 302 (or from a portion thereof). In some implementations, the deposition tool 102 may form a photoresist layer on the buffer layer 218, the exposure tool 104 may expose the photoresist layer to a radiation source to pattern the photoresist layer, the developer tool 108 may develop and remove portions of the photoresist layer to expose the pattern, the etch tool 106 may etch the portion of the buffer layer 218 on the bottom side of the substrate 302, and the photoresist removal tool 110 may remove the remaining portions of the photoresist layer (e.g., using a chemical stripper and/or another technique) after the etch tool 106 etches the portion of the buffer layer 218.

Figure 3D:
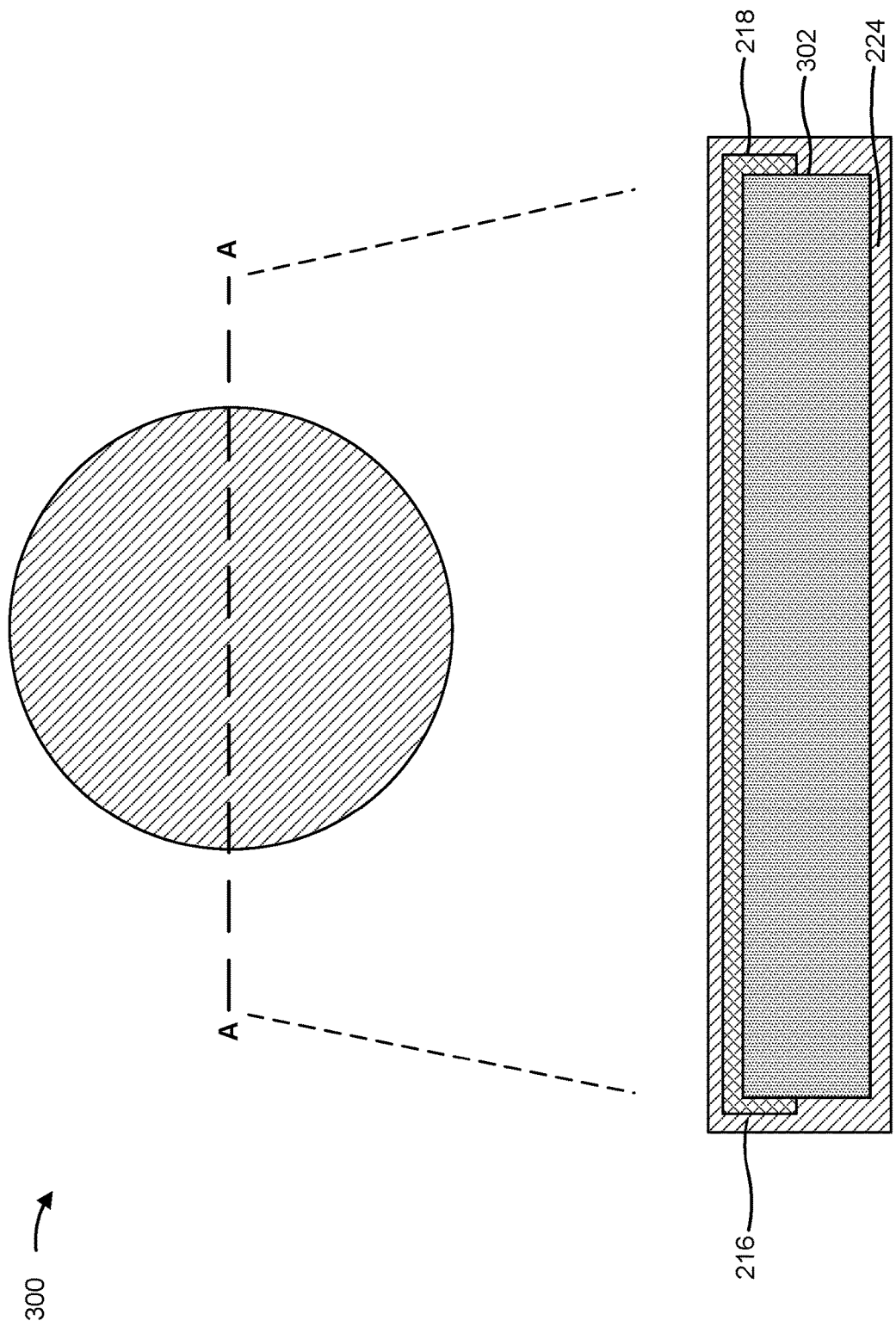
Figure 3E:
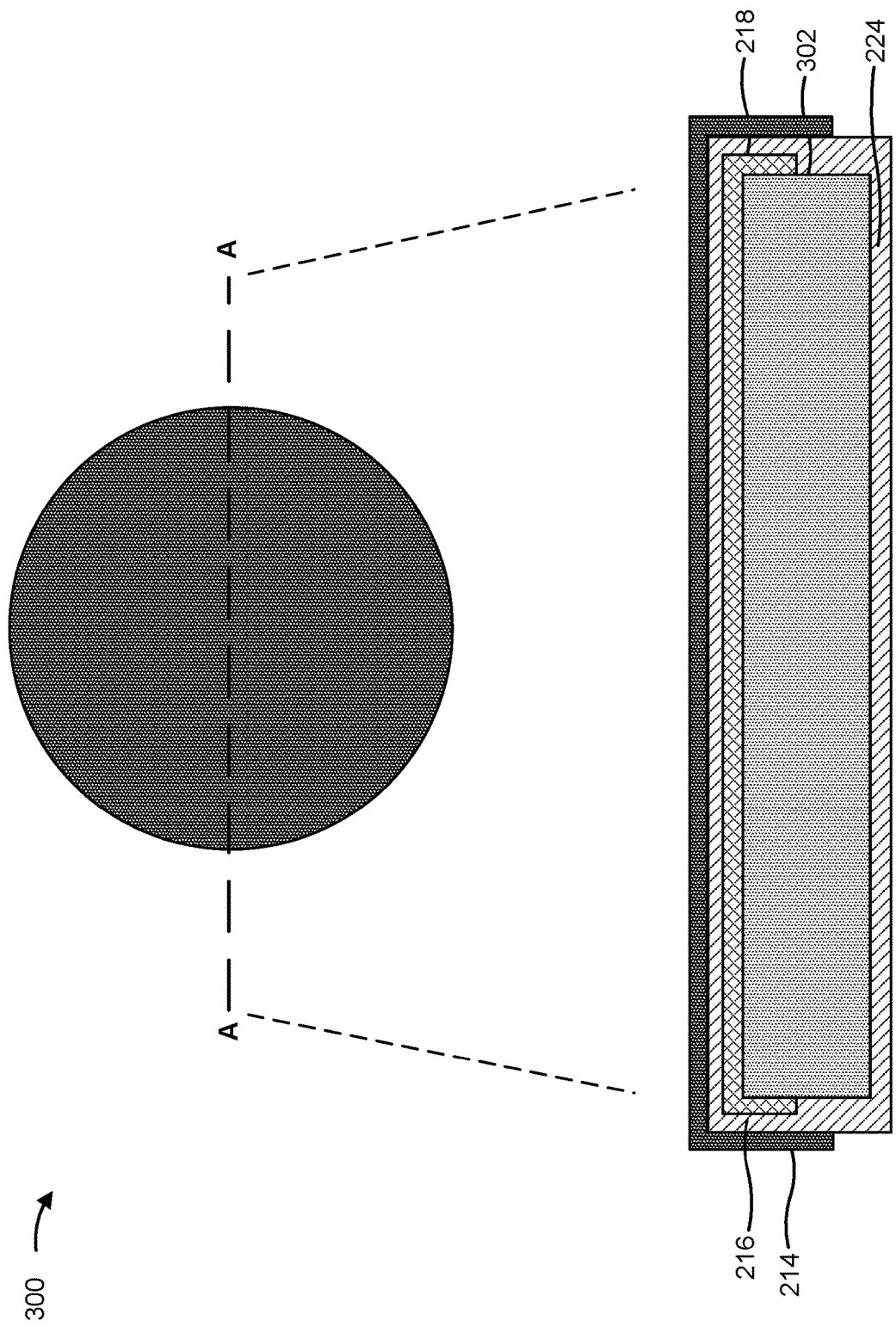
Figure 3F:
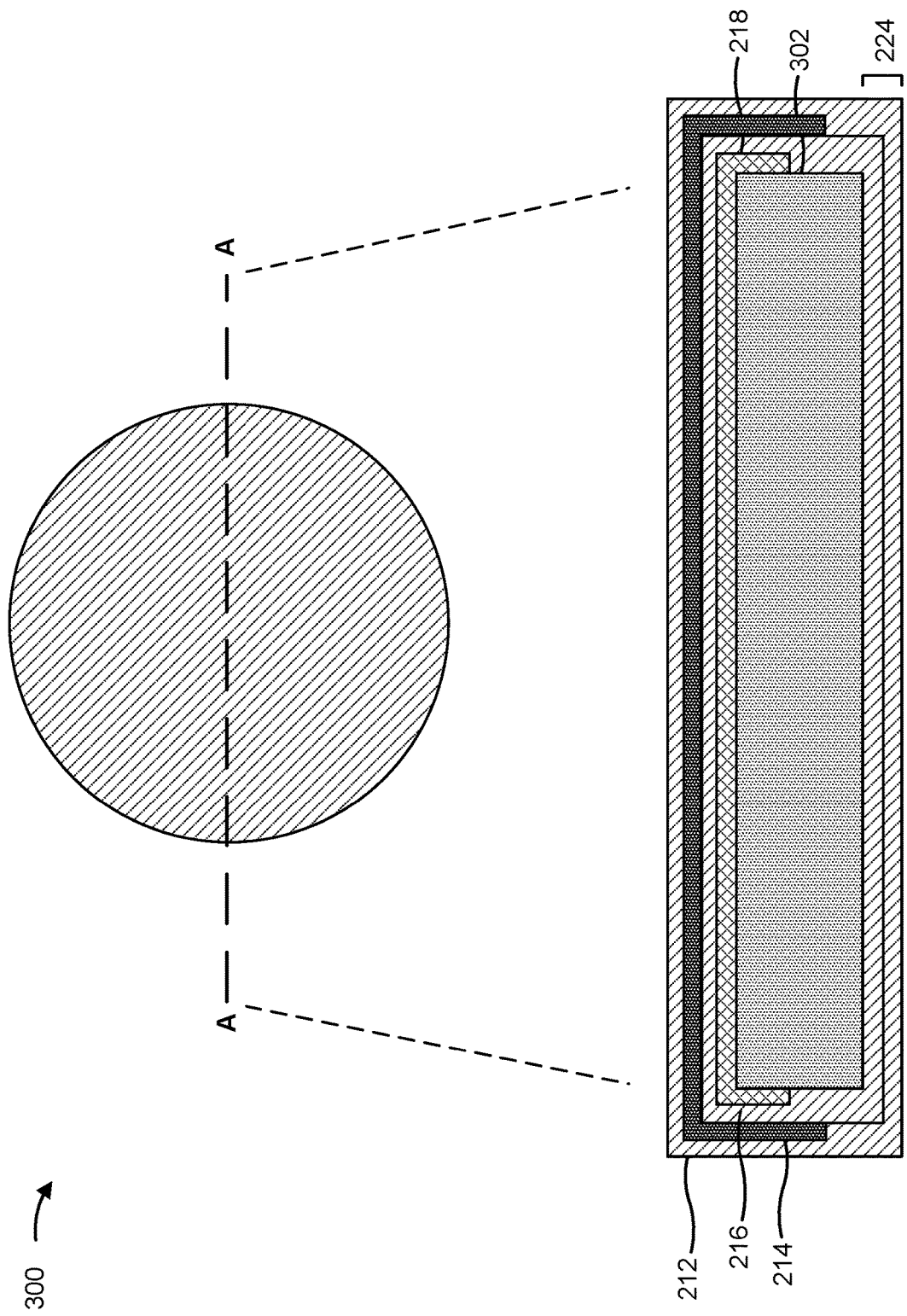

FIGS. 3D-3F illustrate respective top-down views and respective cross-sectional views along the line AA of the substrate 302. As shown in FIGS. 3D-3F, one or more semiconductor processing tools may form a plurality of layers to form a pellicle 210 and to form a lower capping layer 224. For example, the deposition tool 102 may form the plurality of layers by a deposition process, such as a spin-coating process, a PVD process, a CVD process, an ALD process, or another type of deposition process. The deposition tool 102 may form one or more of the plurality of layers on the buffer layer 218 over the top side of the substrate 302, and may form one or more of the plurality of layers over and/or on the back side or the bottom side of the substrate 302. In some implementations, the deposition tool 102 forms one or more of the plurality of layers around the substrate 302 (e.g., over the top side, over the bottom side, over the left side, and over the right side).

As shown in FIG. 3D, the deposition tool 102 may deposit the capping layer 216 of the pellicle 210 on the buffer layer 218, and may deposit a first portion of the lower capping layer 224 directly on the bottom side or the back side of the substrate 302 (e.g., without an intervening buffer layer between the first portion of the lower capping layer 224 and the substrate 302). The capping layer 216 and the first portion of the lower capping layer 224 may be formed as part of the same deposition procedure. The capping layer 216 and the first portion of the lower capping layer 224 may be formed of a low-stress material having a tensile strength of less than approximately 600 megapascals (e.g., a silicon oxide ($SiO_x$), a silicon nitride ($Si_xN_y$), a boron nitride (BN), or another material having a tensile strength of less than approximately 600 megapascals) to promote adhesion between the lower capping layer 224 and the substrate 302, and to reduce peeling, delamination, and/or warpage between the lower capping layer 224 and the substrate 302.

As shown in FIG. 3E, the deposition tool 102 may deposit the function layer 214 over the top side of the substrate 302 and on the capping layer 216. As shown in FIG. 3F, the deposition tool 102 may deposit the capping layer 212 over the top side of the substrate 302 and on the function layer 214. Moreover, the deposition tool 102 may deposit a second portion of the lower capping layer 224 directly on the first portion of the lower capping layer 224 over the bottom side or the back side of the substrate 302 (e.g., without an intervening buffer layer between the first portion and the second portion). The capping layer 212 and the second portion of the lower capping layer 224 may be formed as part of the same deposition procedure. The capping layer 212 and the second portion of the lower capping layer 224 may be formed of a low-stress material having a tensile strength of less than approximately 600 megapascals e.g., a silicon oxide ($SiO_x$), a silicon nitride ($Si_xN_y$), a boron nitride (BN), or another material having a tensile strength of less than approximately 600 megapascals) to promote adhesion between to the lower capping layer 224 and the substrate 302, and to reduce peeling, delamination, and/or warpage between the lower capping layer 224 and the substrate 302.

In some implementations, the first portion and the second portion of the lower capping layer 224 may combine into a single continuous capping layer, and the lower capping layer 224 may be referred to as a single capping layer. In some implementations, due to the first portion and the second portion being formed as part of separate deposition procedures, the lower capping layer 224 may be referred to as a plurality of capping layers, where a thin layer of residual native oxide may be disposed between the plurality of capping layers. In these examples, the first portion of the lower capping layer 224 may be referred to as a first capping layer, and the second portion of the lower capping layer 224 may be referred to as a second capping layer.

Figure 3G:
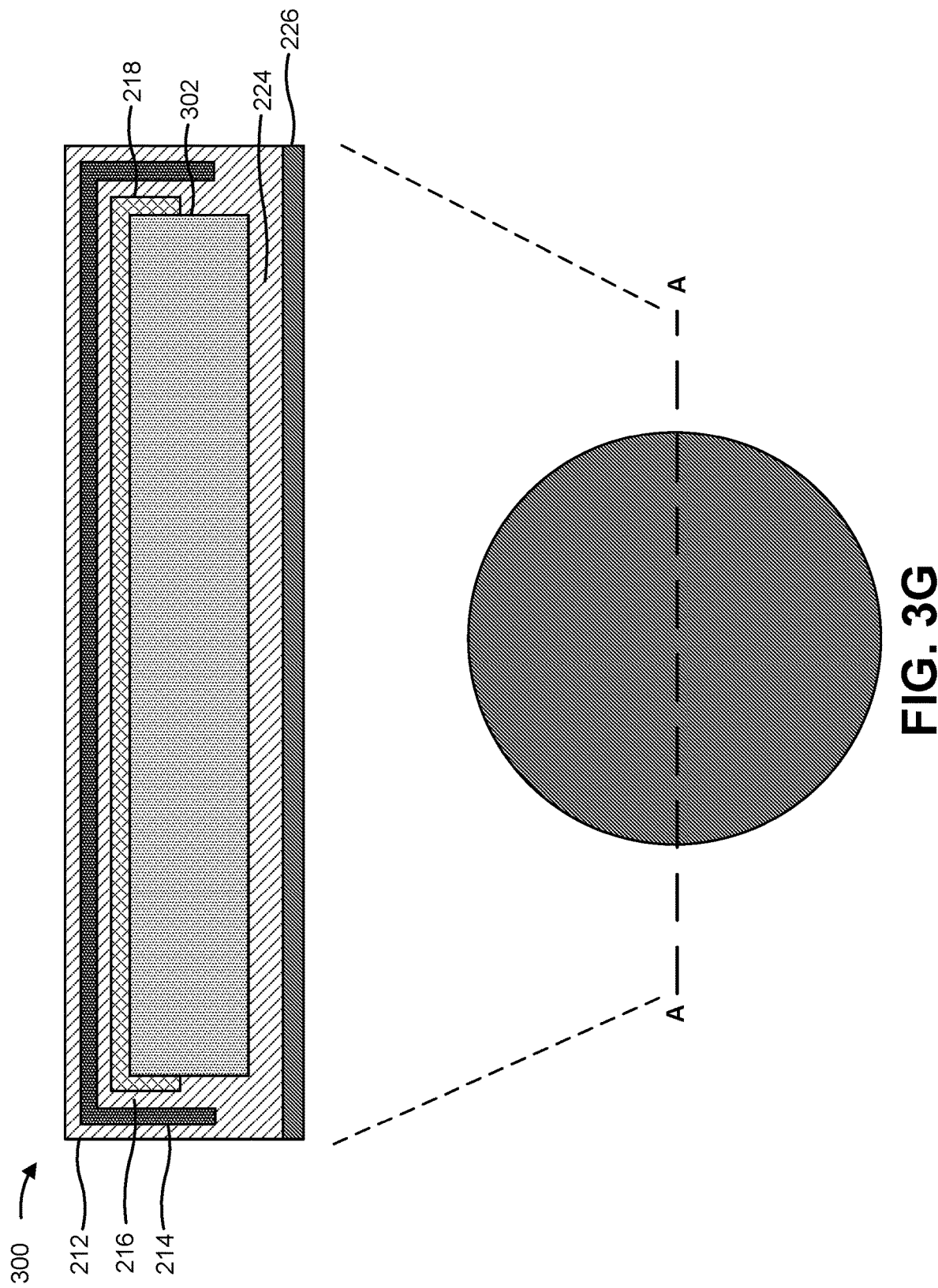

FIG. 3G illustrates another bottom-up view and another cross-sectional view along the line AA of the substrate 302. As shown in FIG. 3G, a semiconductor processing tool may form a hard mask layer 226 directly on the lower capping layer 224 (or directly on the second portion or the second capping layer of the lower capping layer 224) over the back side or the bottom side of the substrate 302. As an example, the deposition tool 102 may deposit the hard mask layer 226 using a spin-coating process, a PVD process, a CVD process, an ALD process, or another type of deposition process.

Figure 3H:
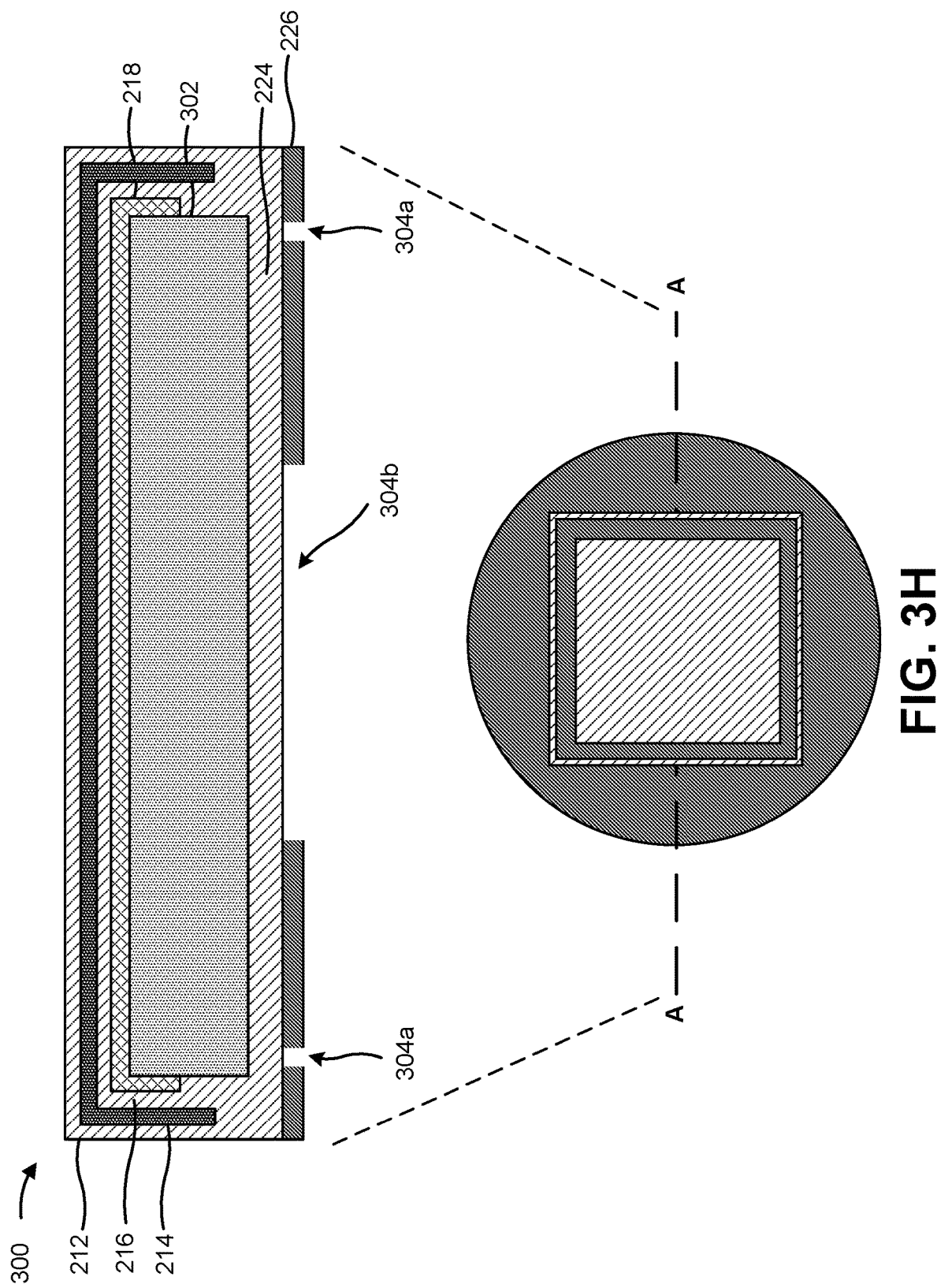

FIG. 3H illustrates another bottom-up view and another cross-sectional view along the line AA of the substrate 302. As shown in FIG. 3H, one or more semiconductor processing tools may form a pattern in the hard mask layer 226. For example, the deposition tool 102 may deposit a photoresist on the hard mask layer 226. The photoresist may be patterned by exposing the photoresist to a radiation source (e.g., using the exposure tool 104) and removing either the exposed portions or the non-exposed portions of the photoresist (e.g., using developer tool 108). The pattern in the hard mask layer 226 may be formed by etching a plurality of portions of the hard mask layer 226 based on the pattern in the photoresist. The photoresist removal tool 110 may remove the remaining portions of the photoresist layer (e.g., using a chemical stripper and/or another technique). The pattern in the hard mask layer 226 may be used to etch the capping layer 212, the function layer 214, the capping layer 216, the buffer layer 218, the lower capping layer 224, and the substrate 302 to form or define a pellicle 210 and a pellicle frame 220 of the photomask assembly 200.

Figure 3I:
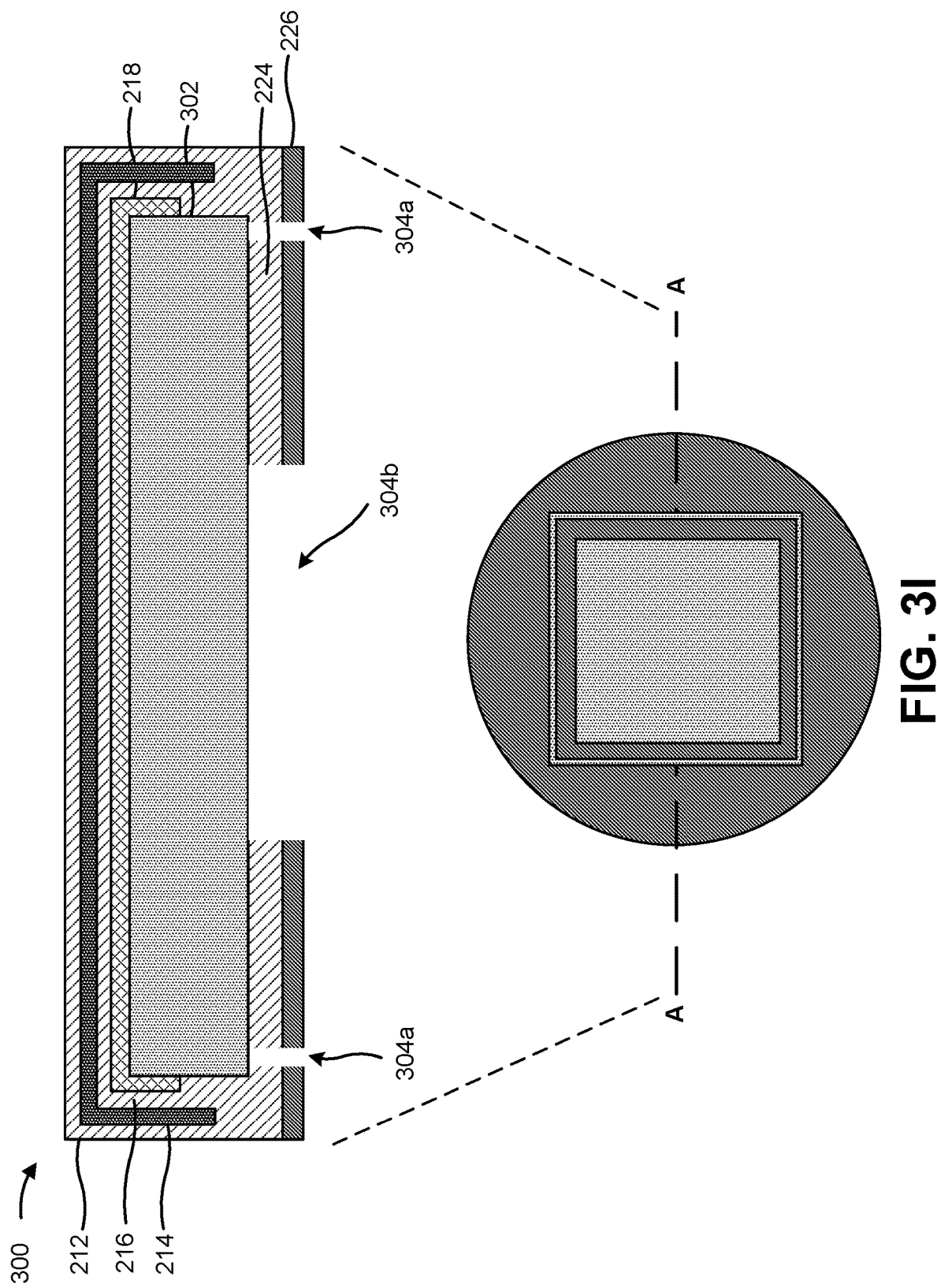

FIG. 3I illustrates a bottom-up view and another cross-sectional view along the line AA of the substrate 302. As shown in FIG. 3I, a semiconductor processing tool may etch a plurality of openings 304 into the lower capping layer 224 on the bottom side or the back side of the substrate 302 to define an inner perimeter and an outer perimeter of the photomask assembly 200. For example, the etch tool 106 may etch an opening 304a into the lower capping layer 224 based on the pattern in the hard mask layer 226 to define an outer perimeter of the photomask assembly 200, and may etch an opening 304b into the lower capping layer 224 based on the pattern in the hard mask layer 226 to define an inner perimeter of the photomask assembly 200. The etch tool 106 may perform a wet etching technique and/or a dry (e.g., plasma-based) etching technique to etch the openings 304 into the lower capping layer 224.

Figure 3J:
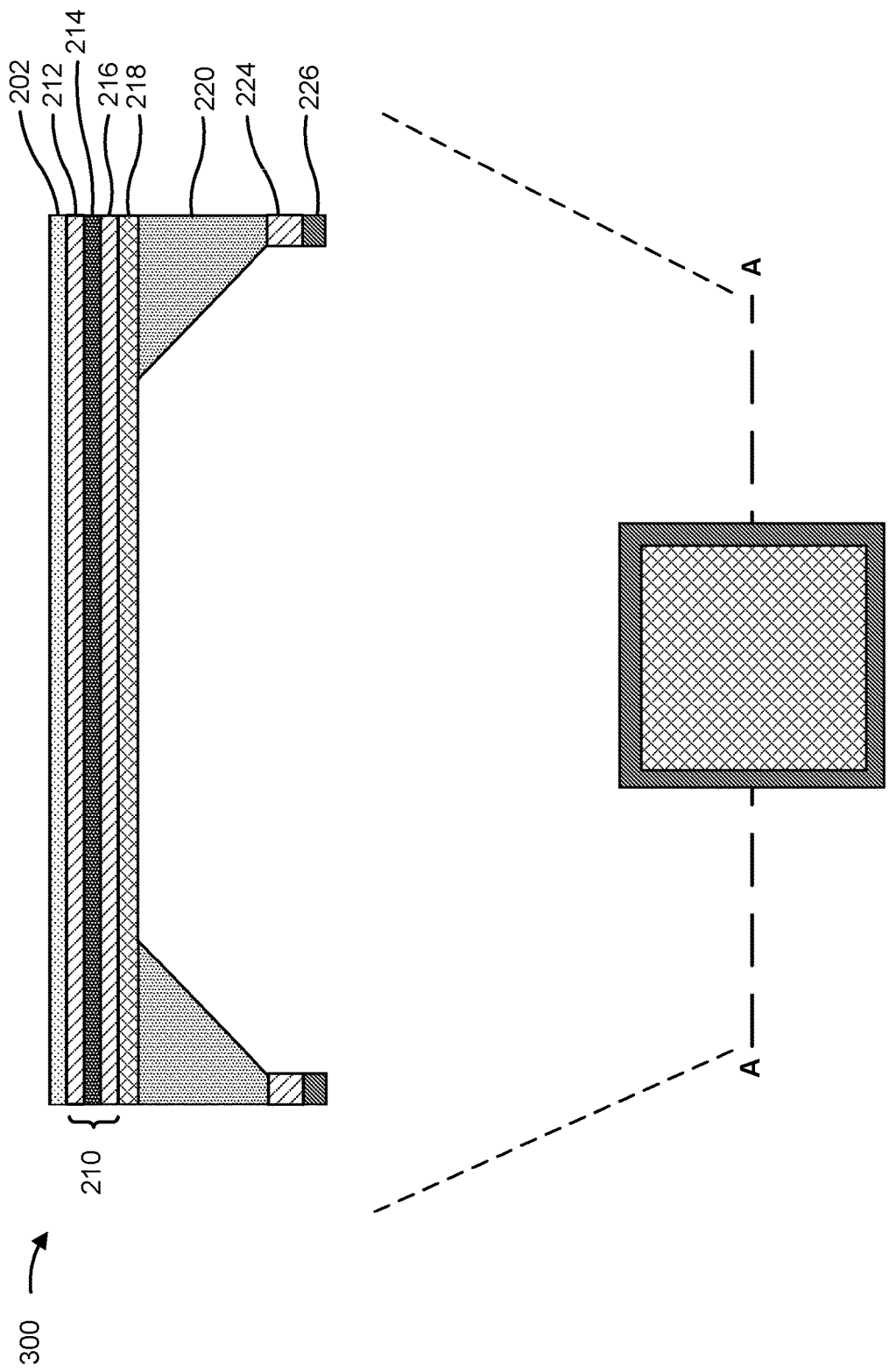

FIG. 3J illustrates another bottom-up view and another cross-sectional view along the line AA of the substrate 302. As shown in FIG. 3J, one or more semiconductor processing tools may etch through the substrate 302 from the bottom of the substrate 302 to define the pellicle frame 220. For example, the etch tool 106 may etch through the substrate 302 from the opening 304a to define an outer side 222b, may etch through the substrate 302 from the opening 304b to define an inner side 222a, and/or the like. Moreover, the etch tool 106 may etch through the buffer layer 218 on the top side of the substrate 302 and the layers of the pellicle 210 on the top side of the substrate 302 from the opening 304a to define the perimeter of the pellicle 210. The etch tool 106 may perform a wet etching technique and/or a dry (e.g., plasma-based) etching technique to define the pellicle frame 220 and the pellicle 210.

As further shown in FIG. 3J, one or more semiconductor processing tools may form a cooling layer 202 on the capping layer 212 above the top side (e.g., top side 222c) of the pellicle frame 220. For example, the deposition tool 102 may form the cooling layer 202 by a deposition process, such as a spin-coating process, a PVD process, a CVD process, an ALD process, or another type of deposition process.

Figure 3K:
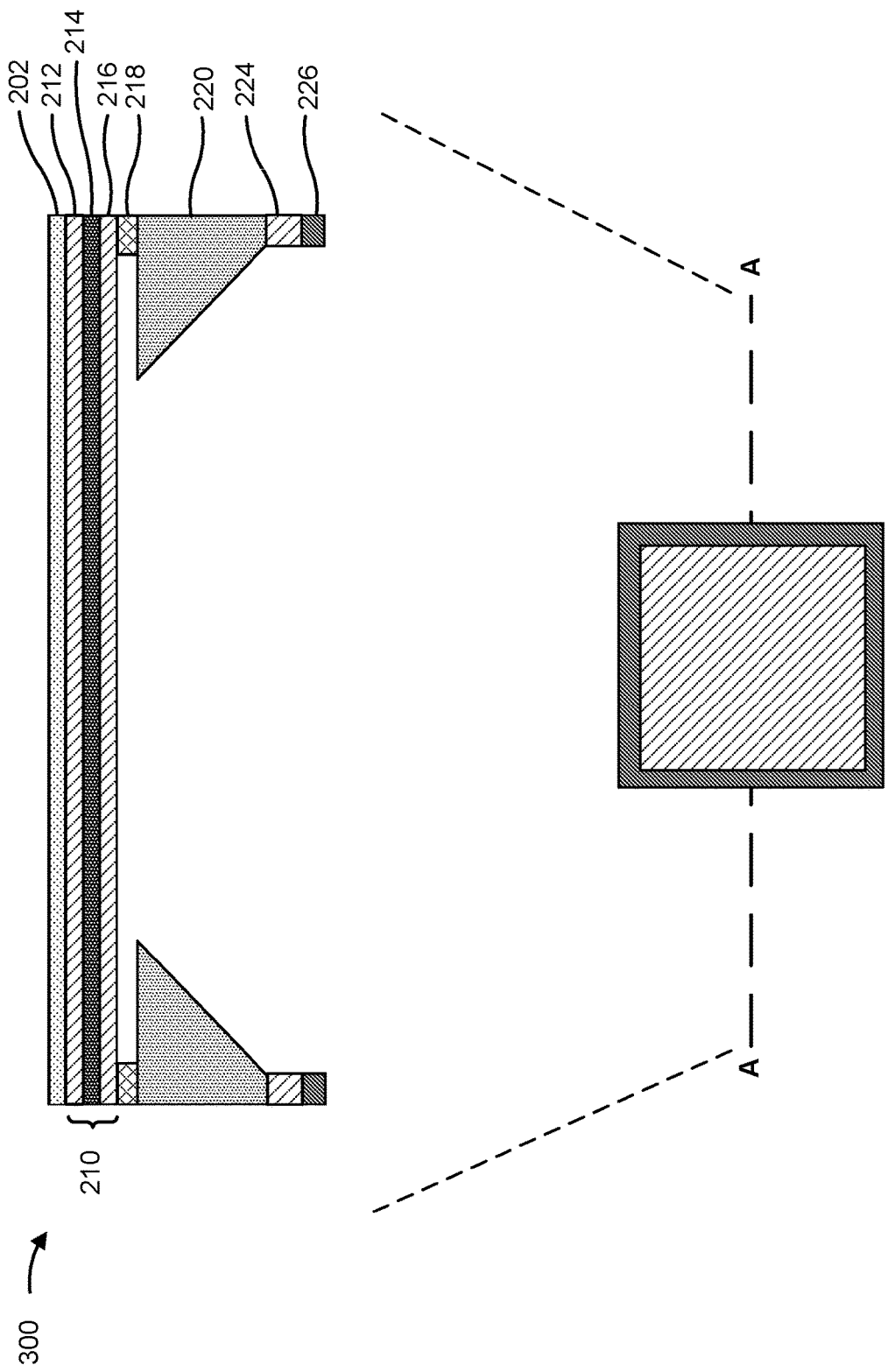

FIG. 3K illustrates another bottom-up view and another cross-sectional view along the line AA of the substrate 302. As shown in FIG. 3K, one or more semiconductor processing tools may remove a portion of the buffer layer 218 from a bottom side of the capping layer 216. For example, the etch tool 106 may perform a plasma etch (e.g., an isotropic plasma etch) to remove the portion of the buffer layer 218 between the inner side (e.g., inner side 222a) of the pellicle frame 220. Moreover, the etch tool 106 may etch a portion of the buffer layer 218 between the top side (e.g., top side 222c) of the pellicle frame 220 and the bottom side of the buffer layer 218.

Figure 3L:
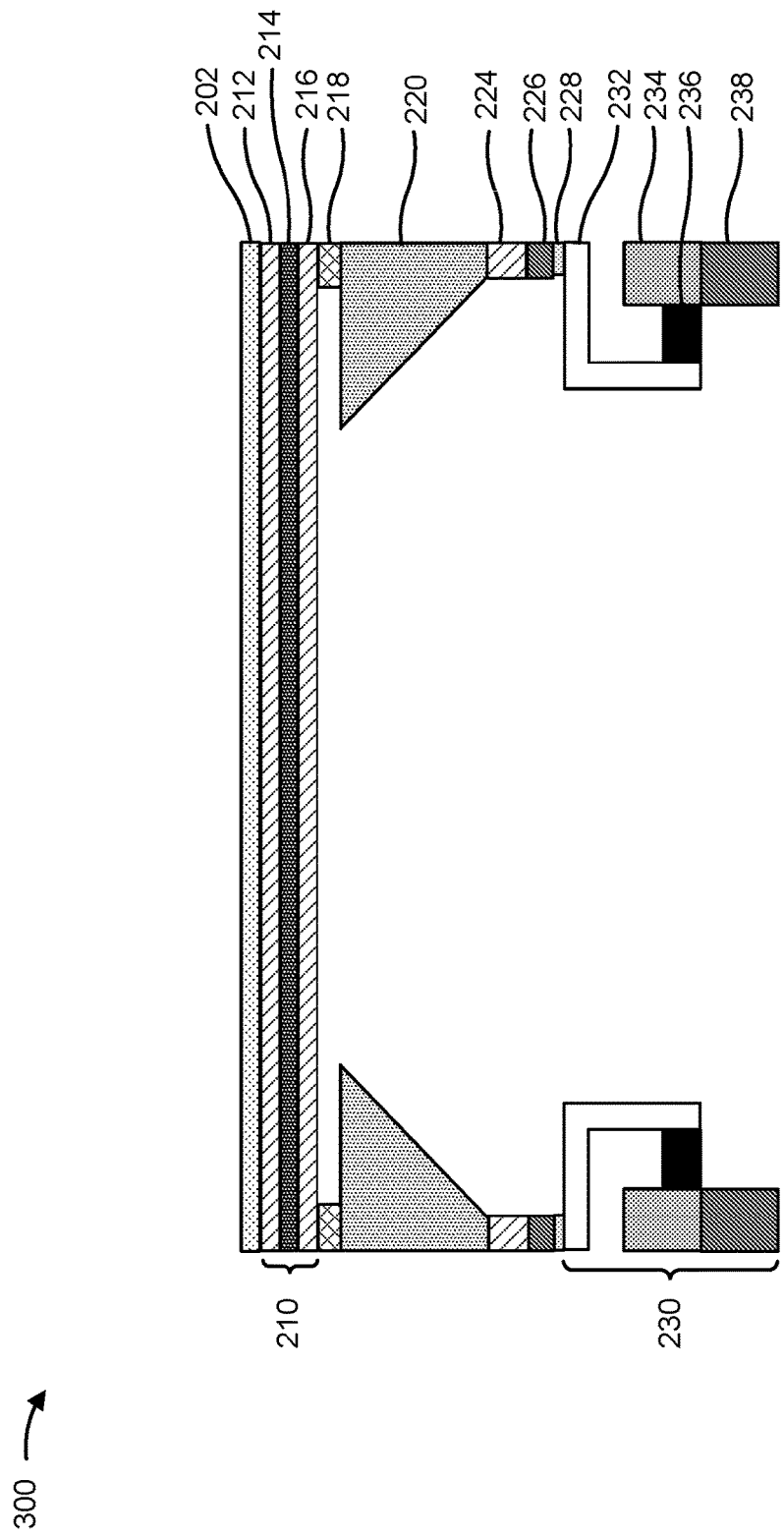

As shown in FIG. 3L, a photomask frame 230 may be attached to the photomask assembly 200. Attaching the photomask frame 230 to the photomask assembly 200 may include attaching a bracket 232 to a bottom of the pellicle frame 220 (e.g., to the hard mask layer 226 on the bottom side 222d of the pellicle frame 220) using a buffer layer 228, attaching the bracket 232 to a sidewall 234 with a filter 236 disposed between the bracket 232 and the sidewall 234, and attaching the sidewall to a gasket 238.

Figure 3M:
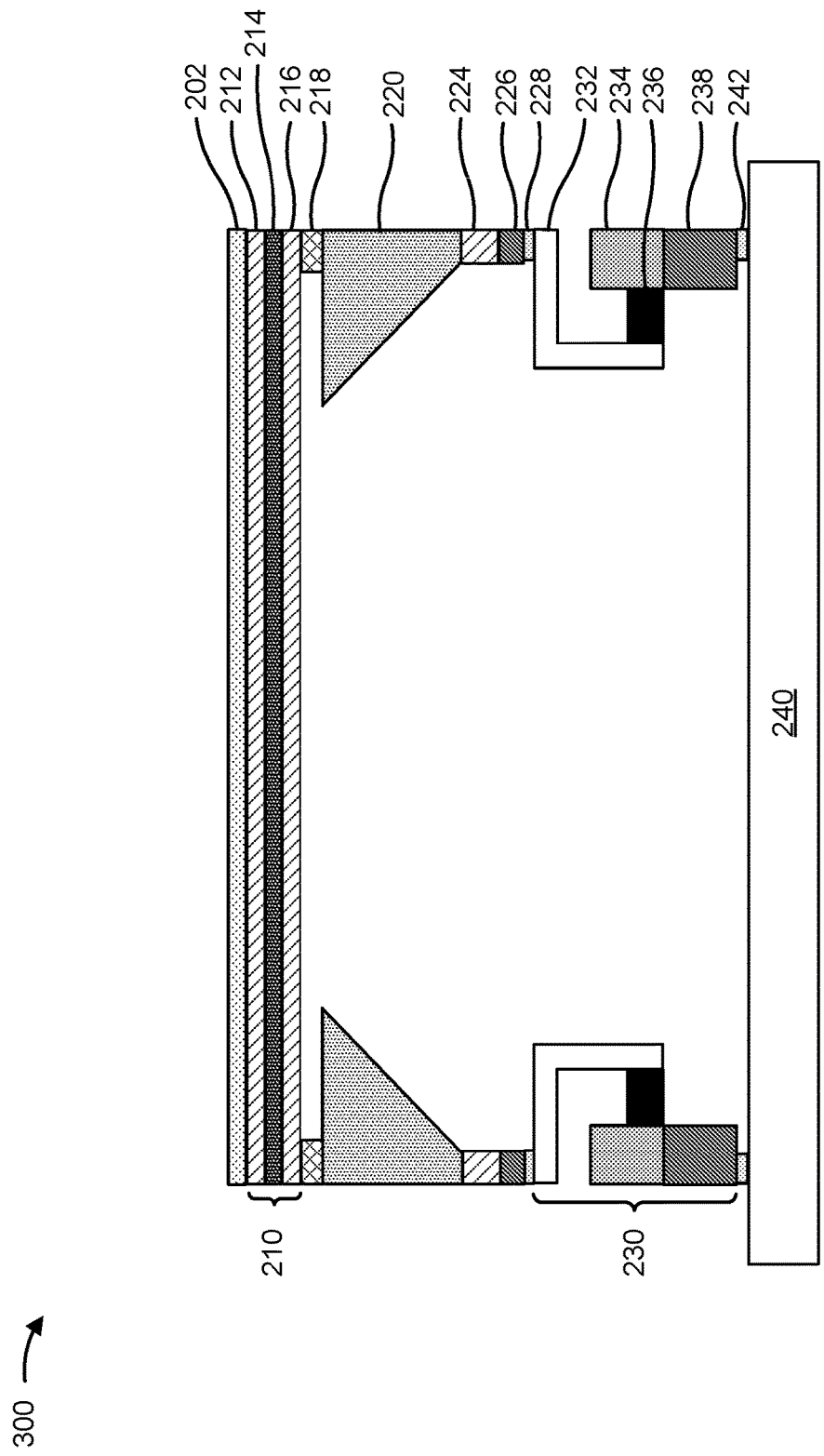

As shown in FIG. 3M, a photomask 240 may be attached to the photomask frame 230. For example, the photomask 240 may be attached to the photomask frame 230 using a buffer layer 242.

As indicated above, FIGS. 3A-3M are provided as one or more examples. Other examples may differ from what is described with regard to FIGS. 3A-3M.

Figure 4:
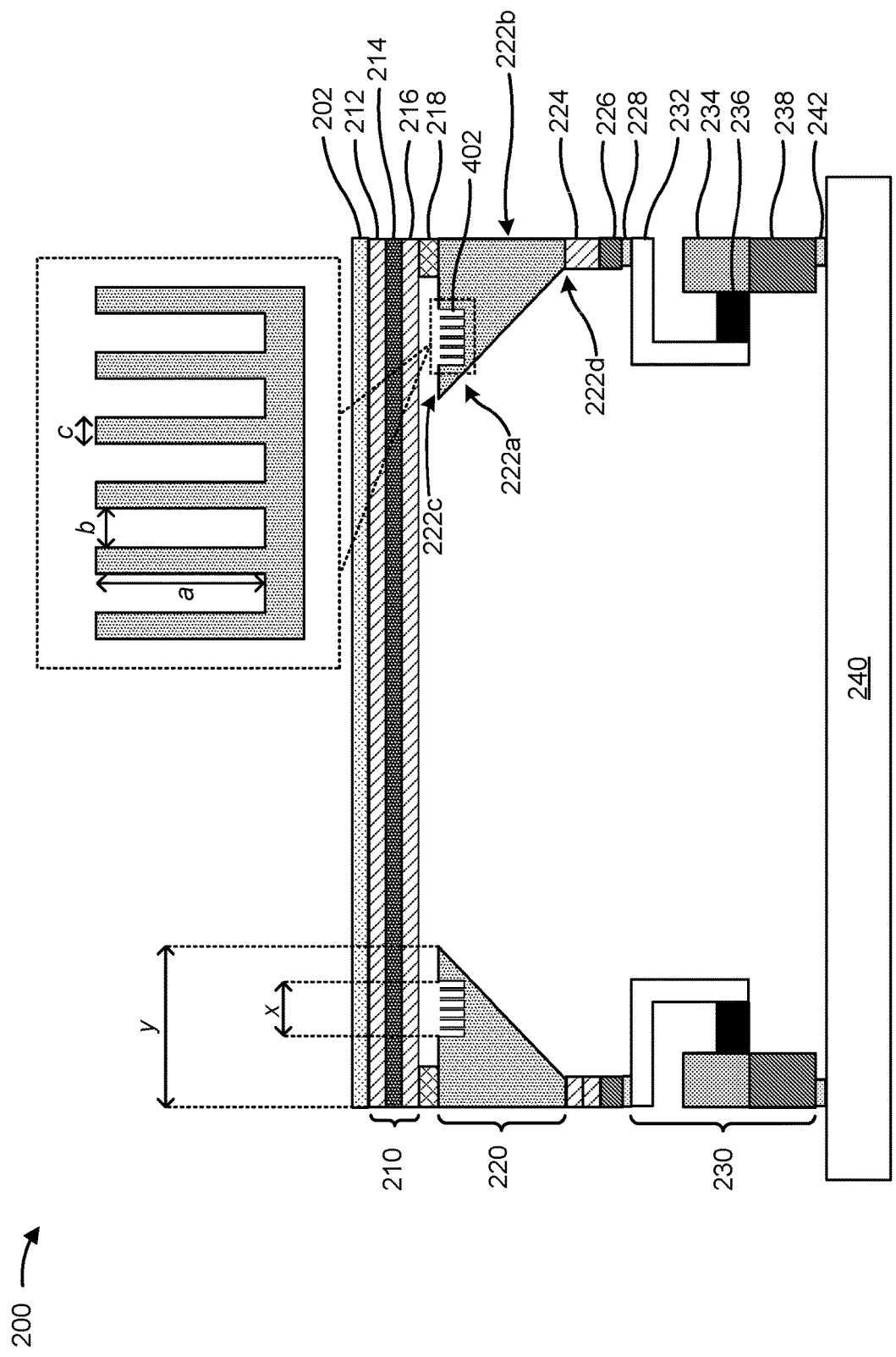
FIG. 4 is a diagram of an example photomask assembly described herein.

FIG. 4 is a diagram of a cross-sectional view of another example of the photomask assembly 200 described herein. In the example in FIG. 4, the photomask assembly 200 may include a similar arrangement of components as shown in FIG. 2. For example, the photomask assembly 200 may include the cooling layer 202 on the pellicle 210 that includes the capping layer 212, the function layer 214, and the capping layer 216. The pellicle 210 may be on the buffer layer 218. The buffer layer 218 may be on the pellicle frame 220. The pellicle frame may have a plurality of sides, such as an inner side 222a, an outer side 222b, a top side 222c, and a bottom side 222d. The lower capping layer 224 may be located directly on the bottom side 222d of the pellicle frame 220, and the hard mask layer 226 may be located directly on the lower capping layer 224. The photomask frame 230 may be attached to the pellicle frame 220 at the hard mask layer 226 with a buffer layer 228 in between the photomask frame and the hard mask layer. The bracket 232 may attach to the hard mask layer 226 via the buffer layer 228, the bracket 232 may attach to the sidewall 234 with the filter 236 disposed between the bracket 232 and the sidewall 234, and the sidewall may attach to the gasket 238. The photomask 240 may attach to the photomask frame 230 via a buffer layer 242.

In the example in FIG. 4, the photomask assembly 200 may additionally include a plurality of stress relieve trenches 402. The one or more stress relief trenches 402 may be formed in the top side 222c of the pellicle frame 220. In particular, the one or more stress relief trenches 402 may be formed in an inner portion of the top side 222c (e.g., a portion of the top side 222c toward or located near the inner side 222a) adjacent to the outer portion in which the pellicle 210 is attached to the pellicle frame 220. The one or more stress relief trenches 402 may provide stress relief for the pellicle 210 during operation of the exposure tool (e.g., during a lithography patterning process). In particular, the one or more stress relief trenches 402 permit the inner portion of the pellicle frame 220 to bend or deform along with the pellicle 210 when the pellicle 210 contacts the pellicle frame 220 (e.g., due to deformation of the pellicle 210). The deformation of the pellicle frame 220 resulting from the one or more stress relief trenches 402 reduces the amount of force or pressure applied to or exerted on the pellicle 210 by the pellicle frame 220 during deformation of the pellicle 210, for example, when the photomask assembly 200 is used in an exposure tool (in particular, when the exposure tool is pressurized to a vacuum).

As shown in FIG. 4, the width x across the one or more stress relief trenches 402 may span a portion of the width y of top side 222c of the pellicle frame 220. For example, the width y of the top side 222c of the pellicle frame 220 may be in a range from approximately 1 millimeters (mm) to approximately 5 mm, whereas the width x across the one or more stress relief trenches 402 may be in a range from approximately 5 microns ($\mu$m) to approximately 10 $\mu$m. Moreover, as shown in the close-up view in FIG. 4, each stress relief trench 402 may have a depth a and width b. In some implementations, the depth a of a stress relief trench 402 is greater than the width b of the stress relief trench 402. In some implementations, the depth a of a stress relief trench 402 is approximately equal to the width b of the stress relief trench 402. In some implementations, the depth a of a stress relief trench 402 is less than the width b of the stress relief trench 402. An example range for a depth a of a stress relief trench 402 may be within a range from approximately 1 $\mu$m to approximately 5 $\mu$m. In some implementations, all of the stress relief trenches 402 may have approximately the same depth a and/or the same width b. In some implementations, two or more stress relief trenches 402 may have different depths a and/or different widths b. Moreover, the spacing c between adjacent stress relief trenches 402 may be the same for all stress relief trenches or may be different for at least a subset of the stress relief trenches 402.

The photomask assembly 200, as illustrated in FIG. 4, may be formed based on a set of procedures and/or techniques illustrated and described above in connection with FIGS. 3A-3M. However, an additional procedure may be performed by one or more semiconductor processing tools to form the one or more stress relief trenches 402 in the substrate 302. For example, the deposition tool 102 may form a photoresist layer on the substrate 302, the exposure tool 104 may expose the photoresist layer to a radiation source to pattern the photoresist layer, the developer tool 108 may develop and remove portions of the photoresist layer to expose the pattern, the etch tool 106 may etch the one or more portions of substrate 302 to form the one or more stress relief trenches 402 in the top side of the substrate 302, and the photoresist removal tool 110 may remove the remaining portions of the photoresist layer (e.g., using a chemical stripper and/or another technique) after the etch tool 106 etches the substrate 302. The buffer layer 218 may be formed on the top side of the substrate 302 after formation of the one or more stress relief trenches 402, which may cause material of the buffer layer 218 to fill at least a portion of the one or more stress relief trenches 402. Accordingly, the material of the buffer layer 218 may also be removed from the one or more stress relief trenches 402 during etching the portion of the buffer layer 218 between the portion of the top side 222c in the pellicle frame 220.

The number and arrangement of components, structures, and/or layers shown in FIG. 4 are provided as one or more examples. In practice, there may be additional components, structures, and/or layers; fewer components, structures, and/or layers; different components, structures, and/or layers; and/or differently arranged components, structures, and/or layers than those shown in FIG. 4.

Figure 5:
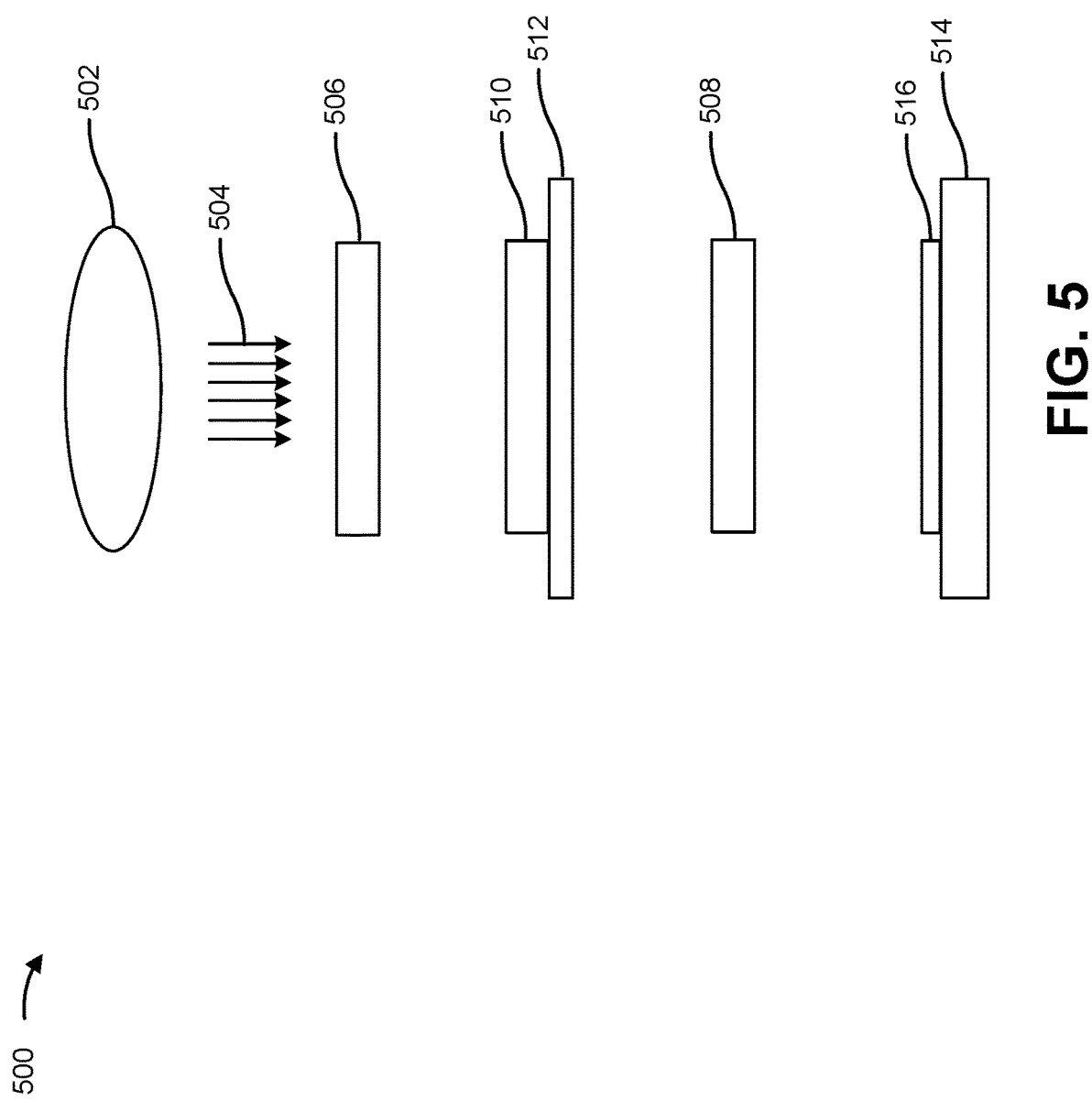
FIG. 5 is a diagram of an example exposure tool.

FIG. 5 is a diagram illustrating an example exposure tool 500. As shown in FIG. 5, the exposure tool 500 may include an exposure source (or radiation source) 502 that emits radiation energy 504, a plurality of optical components (e.g., optical component 506, optical component 508, and/or the like), a photomask assembly 510, a photomask stage 512 configured and designed to secure the photomask assembly 510, and a wafer stage 514 that is configured to secure a wafer 516. The exposure tool 500 may be designed to perform a lithography exposure process in a suitable mode, such as a step-and-scan mode, a scanning mode, a stepping mode, and/or the like. The photomask assembly 510 may include the photomask assembly 200 of FIG. 2 or FIG. 4, or another photomask assembly.

The exposure source 502 may include any suitable light source, such a UV light source, a deep UV (DUV) source, an extreme UV (EUV) source, an X-ray source, an e-beam source, and/or the like. In some implementations, the exposure source 502 may include a mercury lamp having a wavelength of approximately 436 nm or approximately 365 nm, a Krypton Fluoride (KrF) excimer laser with a wavelength of approximately 248 nm, an Argon Fluoride (ArF) excimer laser with a wavelength of approximately 193 nm, a Fluoride (F2) excimer laser with a wavelength of approximately 157 nm, or another light source having a desired wavelength (e.g., below approximately 100 nm). In some implementations, the light source is an EUV source having a wavelength of approximately 13.5 nm or less.

The optical components 506 and 508 may receive the radiation energy 504 from the exposure source 502, may modulate the radiation energy 504 through the pattern of the photomask assembly 510, and may direct the radiation energy 504 to a resist layer coated on the wafer 516. In some implementations, each of the optical components 506 and 508 includes one or more lenses or lens systems that are designed to have a refractive mechanism. In some implementations, such as where the exposure tool 500 is an EUV-based exposure tool, each of the optical components 506 and 508 includes one or more reflective elements or mirrors having a reflective mechanism.

The optical component 506 may include an illumination unit such as a condenser lens, a condenser mirror, and/or the like. The optical component 506 may include a single lens or a lens module having multiple lenses and/or other lens components. For example, the optical component 506 may include a micro-lens array, a shadow mask, and/or another structure designed to aid in directing radiation energy 504 from the exposure source 502 onto the photomask assembly 510.

The optical component 508 may include a projection unit such as a projection lens, a projection mirror, and/or the like. The optical component 508 may have a single lens element or a plurality of lens elements configured to provide proper illumination to the resist layer on the wafer 516. The exposure tool 500 may further include additional components such as an entrance pupil and an exit pupil to form an image of the photomask assembly 510 on the wafer 516, and/or the like.

The photomask stage 512 is configured and designed to secure the photomask assembly 510 by a clamping mechanism, such as vacuum chuck or e-chuck. The photomask stage 512 may be further designed to be operable to move for various actions, such as scanning, stepping, and/or the like. During a lithography exposing process (or exposure process), the photomask assembly 510 may be secured on the photomask stage 512 and positioned such that an integrated circuit pattern (or a layer of a pattern) defined thereon may be transferred to or imaged on the resist layer coated on the wafer 516.

The wafer stage 514 is configured and designed to secure the wafer 516. The wafer stage 514 is further designed to provide various motions, such as transitional motion and/or rotational motion. In some implementations, the wafer 414 includes a semiconductor substrate having an elementary semiconductor material such as crystal silicon, polycrystalline silicon, amorphous silicon, germanium, or diamond, a compound semiconductor material such as silicon carbide or gallium arsenic, an alloy semiconductor material such as silicon germanium (SiGe), gallium arsenide phosphide (GaAsP), aluminum indium arsenide (AlInAs), aluminum gallium arsenide (AlGaAs), or gallium indium phosphorous (GaInP), or a combination thereof. The wafer 414 may be coated with the resist layer that is resistive to etch and/or ion implantation and is sensitive to the radiation energy 504.

The wafer 516 may include a plurality of fields having integrated circuits defined therein for one or more dies. During a lithography exposing process, the wafer 516 may be exposed one field at a time. For example, the exposure tool 500 scans the integrated circuit pattern defined in the photomask assembly 510 and transfers the integrated circuit pattern to one field, then steps to a next field and repeats the scanning until all of the fields of the wafer 516 are exhausted. A field includes one or more circuit dies and a frame region at a boundary area. After the lithography exposure process is applied to the resist layer coated on the wafer 516, the resist layer may be further developed by a developing chemical to form a patterned resist layer that has various openings for subsequent semiconductor processing, such as etching or ion implantation.

In some implementations, the exposure tool 500 is designed for immersion lithography. An immersion liquid, such as water, is filled in the space between the optical component 508 and the wafer stage 514 such that the optical refractive index is increased and the optical resolution of the lithography exposure process is enhanced. In some implementations, the exposure tool 500 includes various components designed and configured to provide, hold, and drain the immersion liquid.

As indicated above, FIG. 5 is provided as an example. Other examples may differ from what is described with regard to FIG. 5.

Figure 6:
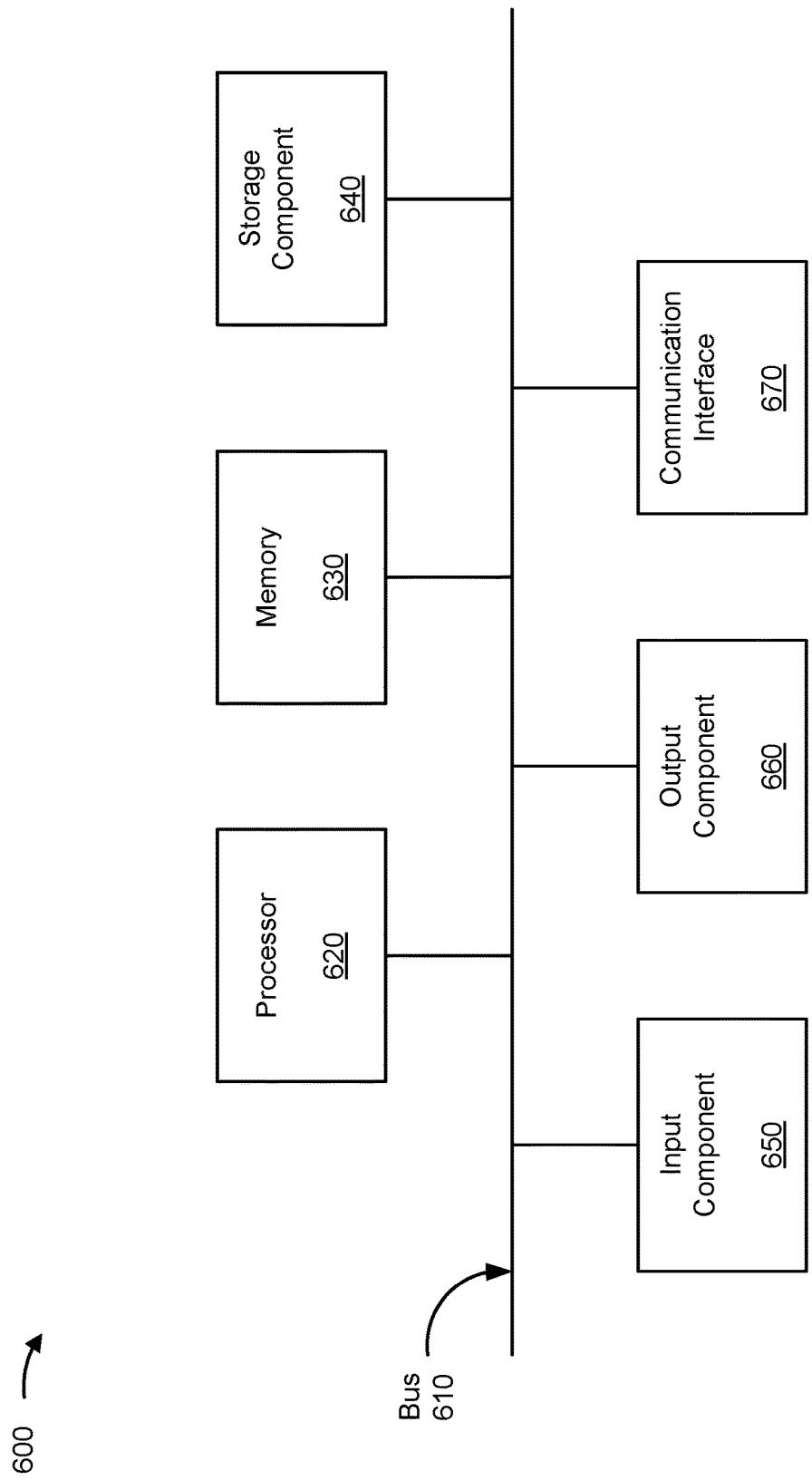
FIG. 6 is a diagram of example components of one or more devices of FIG. 1 and/or FIG. 5.

FIG. 6 is a diagram of example components of a device 600. In some implementations, the deposition tool 102, the exposure tool 104, the etch tool 106, the developer tool 108, the photoresist removal tool 110, the transport device 112, and/or the exposure tool 500 may include one or more devices 600 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, and/or an actuator. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, and/or an antenna.

Device 600 may perform one or more processes described herein. For example, a non-transitory computer-readable medium (e.g., memory 630 and/or storage component 640) may store a set of instructions (e.g., one or more instructions, code, software code, and/or program code) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
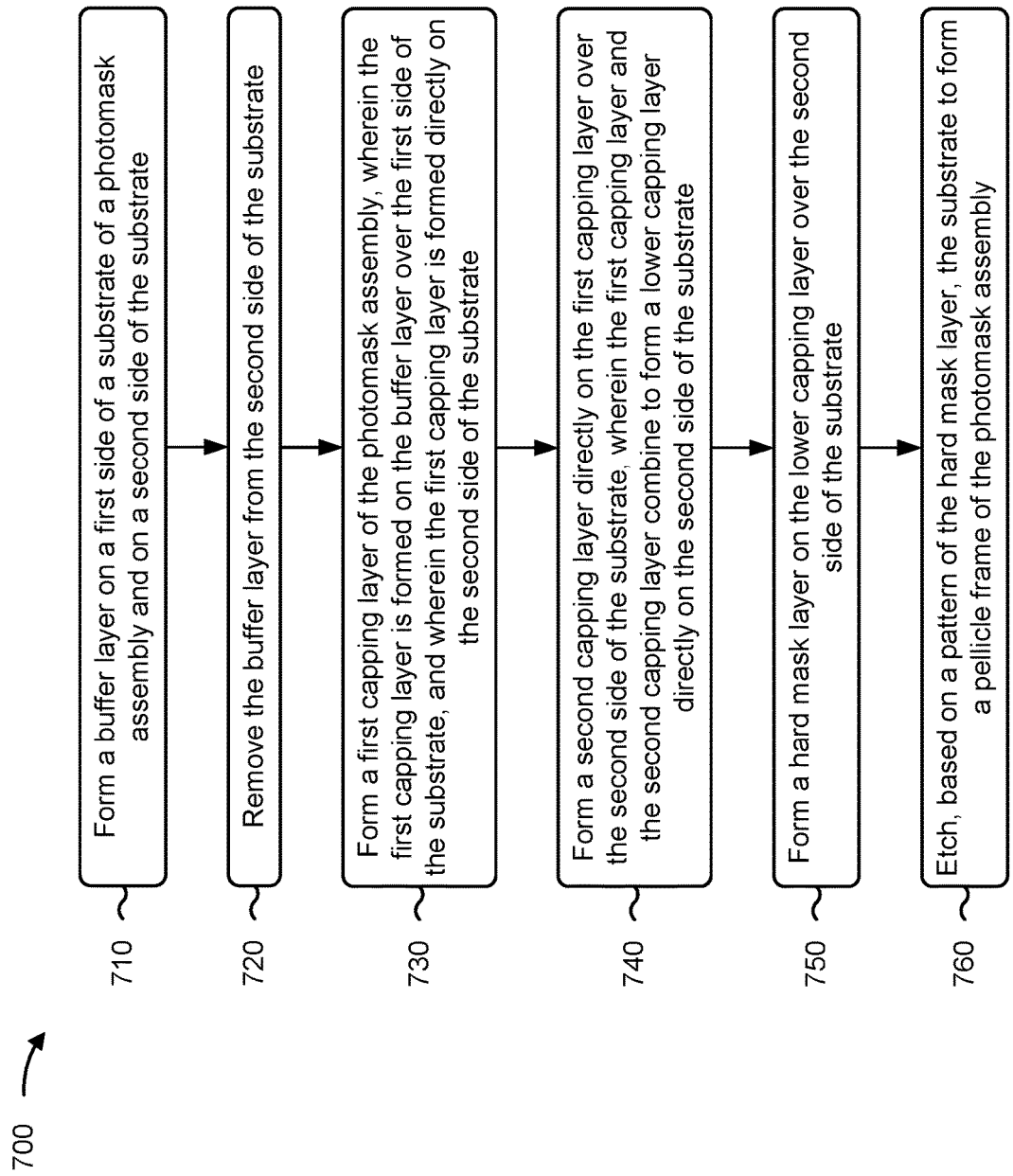
FIG. 7 is a flowchart of an example process relating to forming a photomask assembly.

FIG. 7 is a flowchart of an example process 700 associated with form a photomask assembly. In some implementations, one or more process blocks of FIG. 7 may be performed by one or more semiconductor processing tools (e.g., one or more of the semiconductor processing tools 102-110). Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include forming a buffer layer on a first side of a substrate of a photomask assembly and on a second side of the substrate (block 710). For example, a semiconductor processing tool (e.g., the deposition tool 102) may form a buffer layer 218 on a first side (e.g., the top side) of a substrate 302 of a photomask assembly 200 and on a second side of the substrate 302, as described above.

As further shown in FIG. 7, process 700 may include removing the buffer layer from the second side of the substrate (block 720). For example, one or more semiconductor processing tools (e.g., the deposition tool 102, the exposure tool 104, the etch tool 106, the developer tool 108, and/or another semiconductor processing tool) may remove the buffer layer 218 from the second side (e.g., the bottom side or the back side) of the substrate 302, as described above.

As further shown in FIG. 7, process 700 may include forming a first capping layer of the photomask assembly, where the first capping layer is formed on the buffer layer over the first side of the substrate, and where the first capping layer is formed directly on the second side of the substrate (block 730). For example, a semiconductor processing tool (e.g., the deposition tool 102) may form a first capping layer 216 of the photomask assembly 200, as described above. In some implementations, the first capping layer 216 is formed on the buffer layer 218 over the first side of the substrate 302. In some implementations, the first capping layer 216 (e.g., the first portion of a lower capping layer 224 or the first capping layer of the lower capping layer 224) is formed directly on the second side of the substrate 302.

As further shown in FIG. 7, process 700 may include forming a second capping layer directly on the first capping layer over the second side of the substrate, where the first capping layer and the second capping layer combine to form a lower capping layer directly on the second side of the substrate (block 740). For example, a semiconductor processing tool (e.g., the deposition tool 102) may form a second capping layer 212 directly on the first capping layer 216 over the second side of the substrate 302, as described above. In some implementations, the first capping layer 216 and the second capping layer 212 combine to form a lower capping layer 224 directly on the second side of the substrate 302.

As further shown in FIG. 7, process 700 may include forming a hard mask layer on the lower capping layer over the second side of the substrate (block 750). For example, the semiconductor processing tool may form a hard mask layer 226 on the lower capping layer 224 over the second side of the substrate 302, as described above.

As further shown in FIG. 7, process 700 may include etching, based on a pattern of the hard mask layer, the lower capping layer and the substrate to form a pellicle frame of the photomask assembly (block 760). For example, the semiconductor processing tool may etch, based on a pattern of the hard mask layer 226, the lower capping layer 224 and the substrate 302 to form a pellicle frame 220 of the photomask assembly 200, as described above.

Process 700 may include additional implementations, such as any single implementation or any combination of implementations described below and/or in connection with one or more other processes described elsewhere herein.

In a first implementation, process 700 includes forming (e.g., using the deposition tool 102) a pellicle 210 of the photomask assembly 200 over the first side of the substrate 302, and forming (e.g., using the deposition tool 102) a cooling layer 202 on the pellicle 210. In a second implementation, alone or in combination with the first implementation, forming the pellicle includes forming the first capping layer 216 on the buffer layer 218 over the first side of the substrate 302, forming a function layer 214 on the first capping layer 216 over the first side of the substrate 302, forming the second capping layer 212 on the function layer 214 over the first side of the substrate 302, and etching through the first capping layer 216, the function layer 214, and the second capping layer 212 to form the pellicle.

In a third implementation, alone or in combination with one or more of the first and second implementations, process 700 includes removing (e.g., using the etch tool 106) a portion of the buffer layer 218 between the pellicle 210 and the pellicle frame 220. In a fourth implementation, alone or in combination with one or more of the first through third implementations, forming the first capping layer 216 includes forming the first capping layer 216 of a material that has a tensile strength that is less than approximately 600 megapascals to reduce delamination of the first capping layer 216 from the substrate 302.

In a fifth implementation, alone or in combination with one or more of the first through fourth implementations, process 700 includes attaching a photomask frame 230 to the hard mask layer, and attaching a photomask 240 to the photomask frame. In a sixth implementation, alone or in combination with one or more of the first through fifth implementations, process 700 includes forming (e.g., using the deposition tool 102, the exposure tool 104, the etch tool 106, the developer tool 108, and/or another semiconductor processing tool) a plurality of stress relief trenches 402 in the first side of the substrate 302, where forming the buffer layer 218 on the first side of the substrate 302 includes forming the buffer layer 218 on the first side of the substrate 302 after forming the plurality of stress relief trenches 402 in the first side of the substrate 302.

In a seventh implementation, alone or in combination with one or more of the first through sixth implementations, process 700 includes removing (e.g., using the etch tool 106) material of the buffer layer 218 from the plurality of stress relief trenches 402 after etching the substrate 302 to form the pellicle frame 220.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

In this way, a portion of a buffer layer on a backside of a substrate of a photomask assembly may be removed prior to formation of one or more capping layers on the backside of the substrate. The one or more capping layers may be formed directly on the backside of the substrate where the buffer layer is removed from the substrate, and a hard mask layer may be formed directly on the one or more capping layers. The one or more capping layers may include a low-stress material to promote adhesion between the one or more capping layers and the substrate, and to reduce and/or minimize peeling and delamination of the capping layer(s) from the substrate. This may reduce the likelihood of damage to the pellicle layer and/or other components of the photomask assembly and/or may increase the yield of an exposure process in which the photomask assembly is used.

As described in greater detail above, some implementations described herein provide a photomask assembly. The photomask assembly includes a pellicle frame. The photomask assembly includes a capping layer formed directly on a bottom side of the pellicle frame. The photomask assembly includes a hard mask layer formed directly on the capping layer. The photomask assembly includes a photomask attached to the hard mask layer.

As described in greater detail above, some implementations described herein provide a method. The method includes forming a buffer layer on a first side of a substrate of a photomask assembly and on a second side of the substrate. The method includes removing the buffer layer from the second side of the substrate. The method includes forming a first capping layer of the photomask assembly. The first capping layer is formed on the buffer layer over the first side of the substrate, and the first capping layer is formed directly on the second side of the substrate. The method includes forming a second capping layer directly on the first capping layer over the second side of the substrate. The first capping layer and the second capping layer combine to form a lower capping layer directly on the second side of the substrate. The method includes forming a hard mask layer on the lower capping layer over the second side of the substrate. The method includes etching, based on a pattern of the hard mask layer, the substrate to form a pellicle frame of the photomask assembly.

As described in greater detail above, some implementations described herein provide a photomask assembly. The photomask assembly includes a pellicle frame. The photomask assembly includes a buffer layer on a top side of the pellicle frame. The photomask assembly includes a pellicle on the buffer layer. The photomask assembly includes a first capping layer directly on a bottom side of the pellicle frame. The photomask assembly includes a second capping layer directly on the first capping layer. The photomask assembly includes a hard mask layer directly on the second capping layer. The photomask assembly includes a photomask attached to the hard mask layer by a photomask frame.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An assembly, comprising:
a pellicle frame; and
a photomask frame secured to the pellicle frame without a first intervening buffer layer between the photomask frame and the pellicle frame.

2. The assembly of claim 1, further comprising:
a photomask secured to the photomask frame.

3. The assembly of claim 2, wherein the photomask is secured to the photomask frame via a second intervening buffer layer between the photomask and the photomask frame.

4. The assembly of claim 1, further comprising:
a pellicle secured to the pellicle frame.

5. The assembly of claim 4, wherein the pellicle is secured to a first end of the pellicle frame and the photomask frame is secured to a second end of the pellicle frame, opposite of the first end.

6. The assembly of claim 4, wherein pellicle is secured to the pellicle frame via the first intervening buffer layer.

7. A method, comprising:
forming a pellicle frame; and
securing a photomask frame to the pellicle frame without an intervening buffer layer between the pellicle frame and the photomask frame.

8. The method of claim 7, wherein forming the pellicle frame comprises:
forming a pellicle and the pellicle frame securing the pellicle.

9. The method of claim 8, wherein the pellicle is secured to the pellicle frame via a second intervening buffer layer between the pellicle and the pellicle frame.

10. The method of claim 8, wherein at least a portion of each of the pellicle and the pellicle frame is free from the intervening buffer layer.

11. The method of claim 8, wherein the pellicle comprises a first capping layer, a second capping layer, and a function layer.

12. The method of claim 7, further comprising:
forming a capping layer on the pellicle frame,
wherein the photomask frame is secured to the pellicle frame via the capping layer.

13. The method of claim 12, further comprising:
forming a hard mask layer on the capping layer,
wherein the photomask frame is secured to the pellicle frame via the capping layer and the hard mask layer.

14. A method, comprising:
removing a buffer layer from a bottom side of a substrate;
forming a capping layer on the bottom side of the substrate;
forming a hard mask layer on the capping layer;
etching a plurality of portions of the hard mask layer and the capping layer to define a pellicle frame from the substrate; and
securing a photomask frame to the pellicle frame without an intervening buffer layer between the photomask frame and the pellicle frame.

15. The method of claim 14, wherein etching of the plurality of portions is based on a pattern in the hard mask layer.

16. The method of claim 14, wherein the hard mask layer is on a bottom side of the pellicle frame.

17. The method of claim 14, further comprising:
forming the buffer layer on a top side of the substrate and the bottom side of the substrate; and
removing, based on etching the plurality of portions, a portion of the buffer layer on the top side of the substrate.

18. The method of claim 17, further comprising:
forming, after forming the buffer layer, a second capping layer on the portion of the buffer layer on the top side of the substrate,
wherein another portion of the buffer layer remains between the second capping layer and pellicle frame.

19. The method of claim 18, further comprising:
forming a functional layer on the second capping layer.

20. The method of claim 19, further comprising:
forming a third capping layer on the functional layer.

* * * * *